United States Patent
Phaneuf et al.

(10) Patent No.: US 6,641,705 B2
(45) Date of Patent: Nov. 4, 2003

(54) APPARATUS AND METHOD FOR REDUCING DIFFERENTIAL SPUTTER RATES

(75) Inventors: Michael Phaneuf, Ottawa (CA); Jian Li, Ottawa (CA); Richard F. Shuman, Concord, MA (US); Kathryn Noll, Tewksbury, MA (US); J. David Casey, Jr., Peabody, MA (US)

(73) Assignee: FEI Company, Hillsboro, OR (US)

( * ) Notice: Subject to any disclaimer, the term of this patent is extended or adjusted under 35 U.S.C. 154(b) by 262 days.

(21) Appl. No.: 09/818,988

(22) Filed: Mar. 27, 2001

(65) Prior Publication Data

US 2001/0053605 A1 Dec. 20, 2001

Related U.S. Application Data

(63) Continuation-in-part of application No. 09/522,561, filed on Mar. 10, 2000
(60) Provisional application No. 60/192,488, filed on Mar. 27, 2000, and provisional application No. 60/247,591, filed on Nov. 9, 2000.

(51) Int. Cl.⁷ .......................... C23C 14/34; H01L 21/30
(52) U.S. Cl. ............................ 204/192.34; 204/298.36; 216/66; 427/551; 427/552
(58) Field of Search ....................... 204/192.32, 192.34, 204/298.36; 216/66; 427/551, 552

(56) References Cited

U.S. PATENT DOCUMENTS

| | | | |
|---|---|---|---|
| 4,874,460 A | 10/1989 | Nakagawa et al. | 156/626 |
| 5,188,705 A | 2/1993 | Swanson et al. | 156/643 |
| 5,429,994 A | 7/1995 | Ishikawa | 437/230 |
| 5,435,850 A | 7/1995 | Rasmussen | 118/726 |
| 5,482,802 A | 1/1996 | Celler et al. | 430/5 |
| 5,683,547 A | 11/1997 | Azuma et al. | 156/643.1 |
| 5,851,413 A | 12/1998 | Casella et al. | 216/92 |

FOREIGN PATENT DOCUMENTS

| | | | |
|---|---|---|---|
| FR | 2218157 | 9/1974 | |
| WO | WO89/04052 | 5/1989 | 37/317 |

*Primary Examiner*—Rodney G. McDonald
(74) *Attorney, Agent, or Firm*—Michael O. Scheinberg; David Griner

(57) ABSTRACT

A charged particle beam uniformly removes material, particularly crystalline material, from an area of a target by compensating for or altering the crystal orientation or structure of the material to be removed. The invention is particularly suited for FIB micromachining of copper-based crystalline structures. Uniformity of material removal can be improved, for example, by passing incoming ions through a sacrificial layer formed on the surface of the material to be removed. The sacrificial layer is removed along with the material being milled. Uniformity of removal can also be improved by changing the morphology of the material to be removed, for example, by disrupting its crystal structure or by altering its topography.

39 Claims, 19 Drawing Sheets

(100)Type Plane (110)Type Plane (111)Type Plane

APPARATUS AND METHOD FOR REDUCING DIFFERENTIAL SPUTTER RATES

RELATED APPLICATIONS

This application claims priority from U.S. Provisional Application 60/192,488, filed Mar. 27, 2000, and U.S. Provisional Application 60/247,591, filed Nov. 9, 2000, and is a continuation-in-part of U.S. patent application Ser. No. 09/522,561, filed Mar. 10, 2000.

FIELD OF THE INVENTION

This invention relates generally to charged particle beam milling and, in particular, to an apparatus and method for reducing differential sputter rates in crystalline and other materials.

BACKGROUND OF THE INVENTION

Focused Ion Beam (FIB) microscope systems have been produced commercially since the mid 1980's, and are now an integral part of rapidly bringing semiconductor devices to market. FIB systems produce a narrow, focused beam of charged particles, and scan this beam across a specimen in a raster fashion, similar to a cathode ray tube. Unlike the scanning electron microscope, whose charged particles are negatively charged electrons, FIB systems use charged atoms, hereinafter referred to as ions, to produce their beams. In most commercial FIB systems, the ions used are positively charged gallium ions ($Ga^+$) from liquid metal ion sources, however beams of other ions can be produced. For example, materials such as silicon, indium, cesium or even gases such as argon, krypton or oxygen can be utilized as ion sources.

Modem FIB systems can produce a beam of gallium ions as narrow as approximately 5 nm in diameter. One can increase the current of ions in the beam to operate the FIB as an "atomic scale milling machine," selectively removing materials wherever the beam is placed, and at the same time imaging the sample by correlating the known beam position with electrical signals produced as the incident beam interacts with the specimen. One skilled in the art would understand the operation of this well-known procedure.

Semiconductor devices such as microprocessors can be made up of millions of transistors, each interconnected by thin metallic lines branching over several levels and isolated electrically from each other by layers of dielectric materials. When a new semiconductor design is first produced in a semiconductor fabrication facility, hereinafter referred to as a "fab", it is typical to find that the design does not operate exactly as expected. It is then necessary for the engineers who designed the device to test their design and "rewire" it to achieve the desired functionality. Due to the complexity of building a semiconductor device in the fab, it typically takes weeks or months to have the re-designed device produced. Further, the changes implemented frequently do not solve the problem or expose a yet further difficulty in the design. Iterating through the process of testing, re-designing and re-fabrication can significantly lengthen the time to market of new semiconductor devices.

Over the past decade, techniques have been developed to allow FIB systems to reduce the time required for this procedure of perfecting a design. FIB instruments were first used to "cut" metal lines, typically comprised of alloys of aluminum and/or tungsten, on prototype devices, thus allowing for design verification in simple cases. Further, techniques have been developed using special gas chemistries in the FIB system to permit selective deposition of thin metallic lines to connect two or more conductors, selective removal of dielectric insulators but not metallic interconnects, and selective removal of metal interconnects without removing the dielectric insulators. Techniques have yet further been developed that allow the deposition of insulating materials. Hence, these advances in FIB system technologies now allow the cutting of metal interconnect lines, the insulating of these metal interconnect lines from their surroundings and the re-wiring of the lines to another location. Essentially, these capabilities now permit prototyping and design verification in a matter of days or hours rather than weeks or months as re-fabrication would require. This FIB "rapid prototyping" is frequently referred to as "FIB device modification" or "microsurgery." Due to its speed and usefulness, FIB microsurgery has become crucial to achieving the rapid time-to-market targets required in the competitive semiconductor industry.

Until recently, the typical metals used for metallic interconnects were primarily alloys of aluminum and/or tungsten. The above described advances in FIB system techniques for cutting and depositing metal interconnects were specifically designed for these metal alloys and their particular physical characteristics.

Polycrystalline aluminum interconnect lines are composed of small, contiguous grains of aluminum. Within each grain, the atoms share a regular array-like order, but the relative position of the arrays of atoms can vary from grain to grain. This alignment of the arrays of atoms is known as the "crystallographic orientation" of a given grain. Differences in crystallographic orientation can cause grains sputtered or milled with an ion beam to be removed at different rates, depending on the given orientation. For aluminium though, the difference between most of the slowest sputtering orientations compared to the fastest sputtering orientations is not particularly significant and hence is not a key factor in the techniques to cut and/or remove aluminum interconnects. Additionally, for aluminum, chemistries have been developed that selectively attack aluminum, causing grains of any orientation to sputter much more quickly in the presence of the gas than with just the ion beam alone. This process is well-known within the art and is commonly referred to as Gas Assisted Etching (GAE). In one particular well-known technique, chlorine gas is used to perform GAE of aluminum interconnects, cleanly removing aluminum grains, with little regard to their individual crystallographic orientation. The terms "etch" "mill" and "sputter" are used interchangeably below.

Recently, copper-based interconnects have begun to replace aluminum-based interconnects in state-of-the-art devices due to the increased transmission speeds achievable with the use of copper. Unfortunately, FIB sputtering of copper is more difficult than sputtering aluminum alloys. Firstly, aluminum atoms have a lower atomic mass and less "stopping power" than copper atoms, and simple ion beam milling of the copper atoms is less effective than the equivalent milling of aluminum. Further, a gas chemistry that permits GAE of copper has not yet been successfully developed. And yet further, the relative sputter rate between grains of different crystallographic orientations of copper can differ by a large factor, this factor being approximately 360% in some experimental tests.

Some of the difficulties that can occur when attempting to sputter copper interconnects that have different crystallographic orientations will now be described by example with reference to FIG. 1 and FIGS. 2A through 2I. FIG. 1 illustrates portions of three grains in a typical section of copper interconnect, sections 2, 3, and 4. The grains at each end section 2 and 4, in this example, have similar orientations, while the grain in the center section 3 is quite different. Consider a situation where the grains at each end section 2 and 4 are "slow milling", whereas the grain in the center section 3 is "fast milling." FIGS. 2A through 2I illustrate these three grain sections 2, 3, and 4 in the cross-section of a semiconductor device with two levels of copper interconnect. The three grain sections from FIG. 1 are represented in copper layer 5 in FIGS. 2A through 2I. As in a "real" device, they are covered with a protective dielectric material 6. They are also isolated, in the vertical dimension, from lower level conductors by a dielectric material 7. A second, lower layer of conductive interconnect is represented by a copper layer 8. Subsequent lower levels of the device containing transistors, etc. are not shown for clarity. Additionally, one skilled in the art would realize that copper layers 5 and 8 would extend to the left and right of the figure to carry electrical signals necessary to the functioning of the device and that the layers and grains are not shown to scale.

For purposes of illustration, FIGS. 2A through 2I show the case where it is necessary to perform microsurgery to modify the device by "cutting" copper layer 5 (milling away all the conductive copper to produce an "open circuit" along this metal line) so as to verify a design change. FIGS. 2A and 2B illustrate the first steps, that is dielectric material 6 being removed by bombardment of ions 9 to expose copper layer 5. Dielectric materials tend to mill very uniformly in the FIB. In FIG. 2C, the incident $Ga^+$ ion beam has cleanly and uniformly removed all of dielectric material 6, and begins to mill copper layer 5. As discussed above with reference to FIG. 1, copper layer 5 is composed of the three grain sections 2, 3, and 4 of copper, each end grain section 2 and 4 possessing a "slow" milling orientation, while the central grain section 3 has a "fast" milling orientation. FIG. 2D illustrates the result of the difference in milling speeds, that is the central "fast milling" grain section 3 is almost completely removed before even 25% of the thickness of the end grain sections 2 and 4 have been milled away. FIG. 2E illustrates the point where the central "fast" milling grain of copper layer 5 has been completely removed by FIB milling, while the "slow" milling grains at either end still retain more than 50% of their initial thickness.

At this point, one could assert that the initial requirement to "cut" copper layer 5 to provide an open circuit appears to have been accomplished. However, due to the three dimensional nature of the grains (not shown in FIGS. 2A through 2I, as the third dimension would be into the page), it is frequently necessary to proceed beyond this point to remove surrounding grains that would still be making connections ("closed circuit") in the third dimension of the metal line.

FIGS. 2F and 2G show the continuation of the milling process. As the central grain of copper layer 5 is now gone, dielectric material 7 begins to be milled away by the incident ion beam in the region below the now-removed "fast" milling central grain section 3 of copper layer 5. In a short time, this portion of dielectric material 7 is also milled away.

In FIG. 2H, the now exposed portion of copper layer 8 is now milled by the ion beam. If this portion also happens to contain a "fast milling" orientation of copper, it too is rapidly removed.

FIG. 2I shows the point where the last of copper layer 5 is finally milled away by the ion beam. Unfortunately, during this time, sufficient milling has occurred to the "fast" milling copper grains in copper layers 5 and 8 that the center of copper layer 8 has also been milled away, inadvertently cutting the interconnect line of copper layer 8, causing an unwanted open-circuit in this signal as well. To illustrate the effect of crystal orientation on milling rate, FIGS. 2A through 2I show that milling is uniform with a crystal grain although the milling is often non-uniform even within a single crystal grain of copper.

There are numerous other situations where this orientation induced difference in relative sputter rates in copper poses other difficulties. If FIB milling stopped at the point represented in FIG. 2G above, copper layer 8 is still intact, but now exposed. Subsequent deposition of conductive material in the FIB microsurgery process could lead to an unwanted short-circuit between the FIB deposited conductive layer and the now exposed copper layer 8.

Hence, there is a need for an improved technique to perform milling of copper, and more generally there is a need for an improved technique for milling elements that have large changes in milling rates based upon grain orientation. This improved milling technique will preferably lead to more uniform milling of such elements when being performed by an FIB.

SUMMARY OF THE INVENTION

The present invention comprises methods and apparatus for using a charged particle beam to uniformly remove material, particularly crystalline material, from an area of a target. The invention reduces differential sputter rates of crystalline structures and is particularly suited for FIB microsurgery of copper-based crystalline structures.

Uniformity of material removal can be improved by passing incoming ions through a layer formed on the surface of the material to be removed. Because the layer is typically removed during the milling process, it is referred to as a sacrificial layer. Uniformity of removal can also be improved by changing the morphology of the material to be removed, for example, by disrupting its crystal structure or by altering its topography.

In accordance with a preferred embodiment of the invention, a layer is formed over the material to be removed and an ion beam is directed toward the target. The layer interacts with the ion beam material removal process to increase the uniformity of the material removal by the ion beam.

The layer is preferably formed by the decomposition of a precursor gas in the presence of the ion beam. The deposition of the layer and the removal of the material are preferably a dynamic process, in which the layer is deposited by interaction of the precursor gas with the ion beam, the deposited layer then interacts with the ion beam to assist the removal of the material, and the layer itself is removed by the ion beam. This process preferably repeats at each dwell point of the ion beam until the material to be removed is completely removed.

According to one embodiment of the present invention, the method further includes applying a plurality of primer atoms prior to the applying of the sacrificial layer, the primer atoms enhancing the effectiveness of the sacrificial layer.

According to another embodiment of the present invention, the method further includes applying a plurality of de-conductive atoms that operate to diminish the conductivity of any residue left over from the sputtering operation. For instance, this de-conductive atom could comprise water vapour, oxygen molecules and/or other oxidizing agents.

According to another embodiment of the present invention, the method further includes milling the material in at least two steps, the first step resulting in an uneven morphology of the material and the final step resulting in a smooth, relatively planar floor at the milled area.

According to another embodiment of the present invention, the method further includes applying the ion beam in one or more steps at first dwell points or pixels spaced further apart than the beam diameter and then, to produce a smooth finish, at second dwell points spaced closer together than the beam diameter, a sacrificial layer preferably being applied while milling at the first dwell points and optionally, though not preferably, while milling at the second dwell points.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

The preferred embodiment of the present invention is described with reference to the following figures, in which:

FIG. 15A shows the results of applying a first milling box to the sample. FIG. 15B shows the application of a second milling box to the sample from FIG. 15A, FIG. 15C shows the application of a third milling box to the sample from FIG. 15B, and so forth.

DETAILED DESCRIPTION OF THE PREFERRED EMBODIMENT

Preferred embodiments of the present invention are directed to an apparatus and method used for milling of materials, particularly crystalline materials such as copper-based metal lines within semiconductor devices. Although much of the following description is directed toward copper milling and specifically copper milling within semiconductor devices, the apparatus and methods of the present invention could equally be utilized in the milling of other materials. The techniques described herein can be used by themselves or in combination with other techniques. Hence, the scope of the present invention should not be limited to simply the milling of copper-based crystalline structures.

Figure 1:
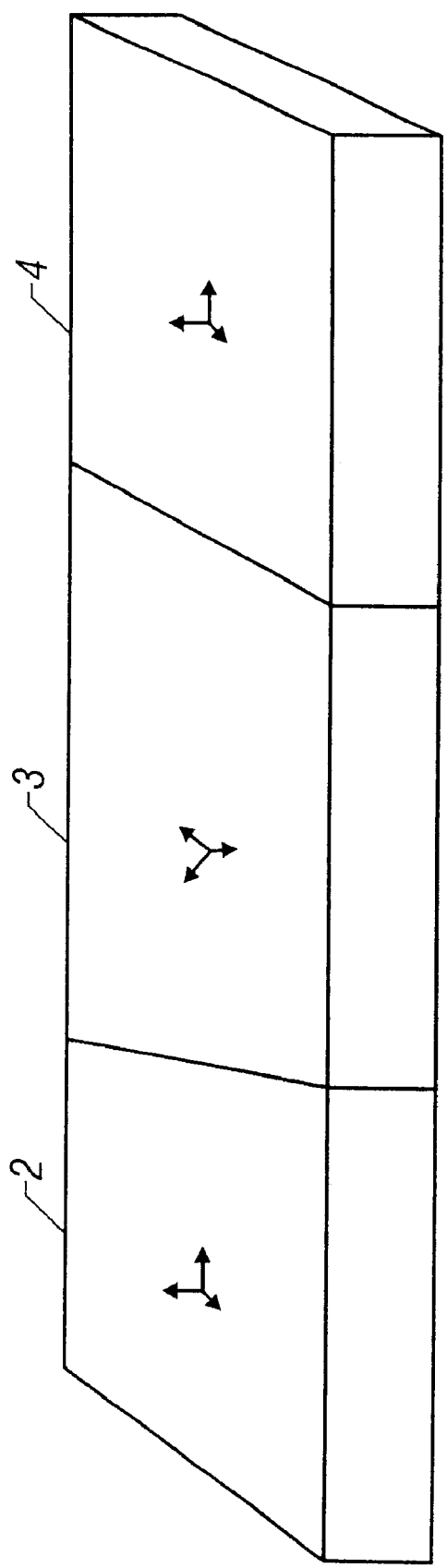
FIG. 1 illustrates a three-dimensional view of a piece of copper split into three sections of different grain orientations.
Figure 2A:
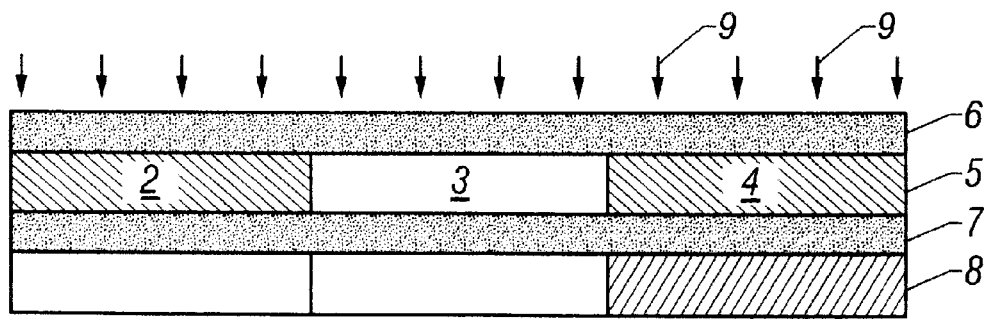
FIGS. 2A through 2I illustrate cross-sectional views of a semiconductor device being milled at different stages according to a well-known microsurgery technique.
Figure 2B:
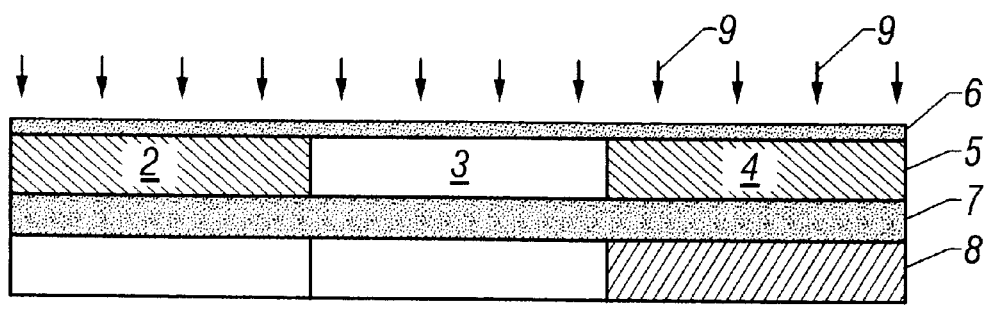
Figure 2C:
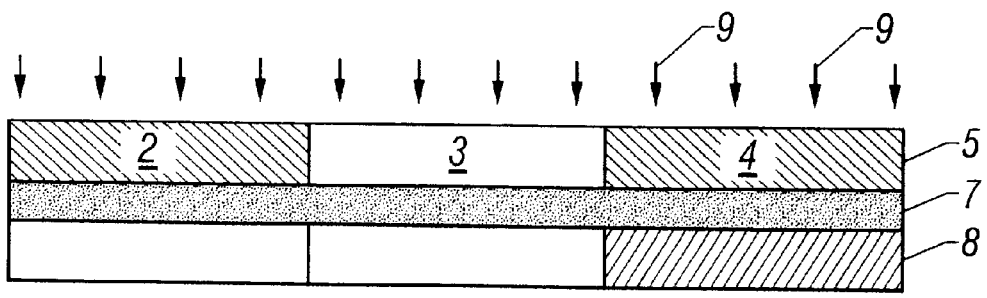
Figure 2D:
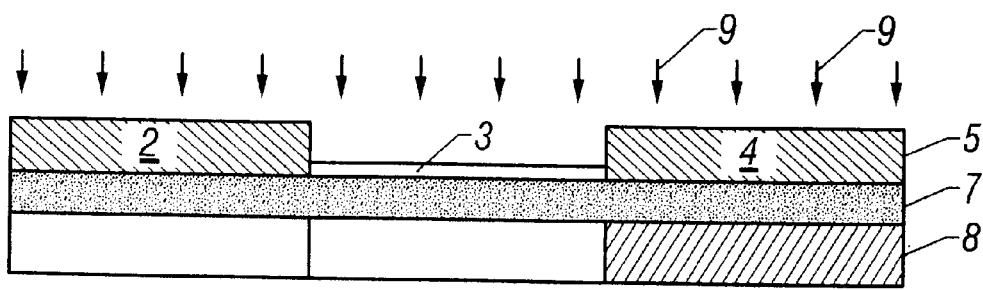
Figure 2E:
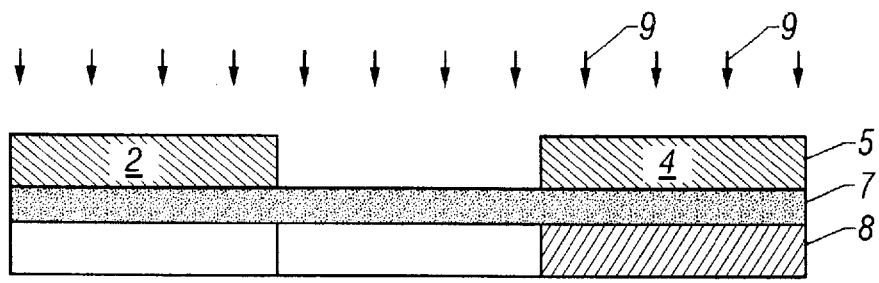
Figure 2F:
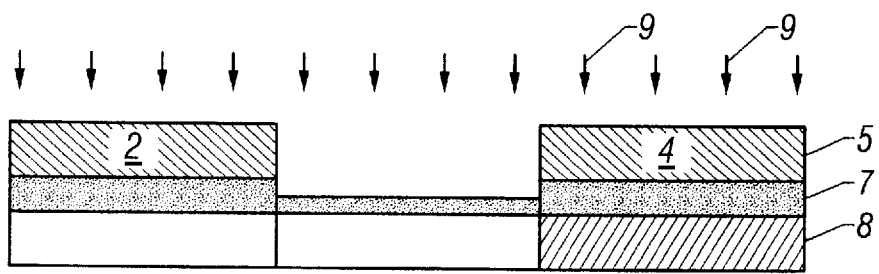
Figure 2G:
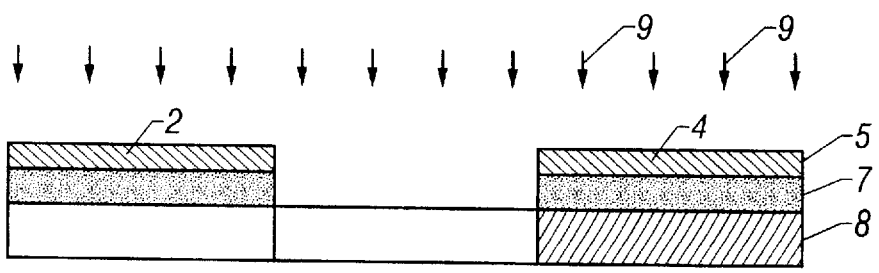
Figure 2H:
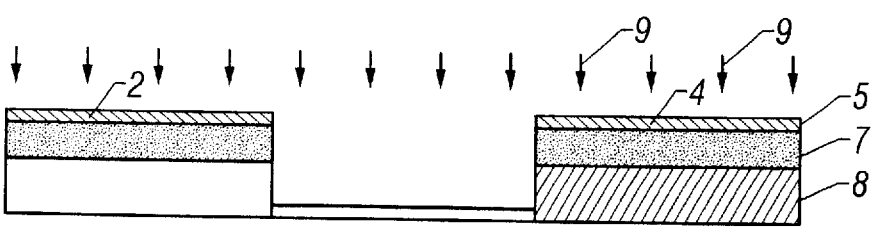
Figure 2I:
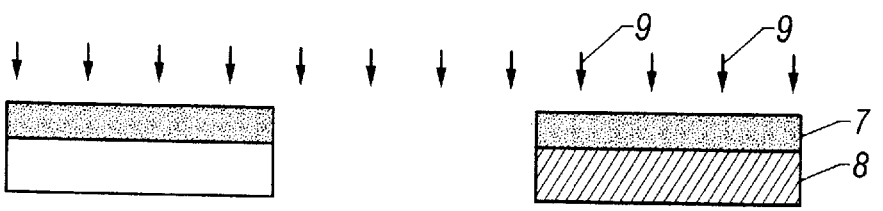
Figure 3:
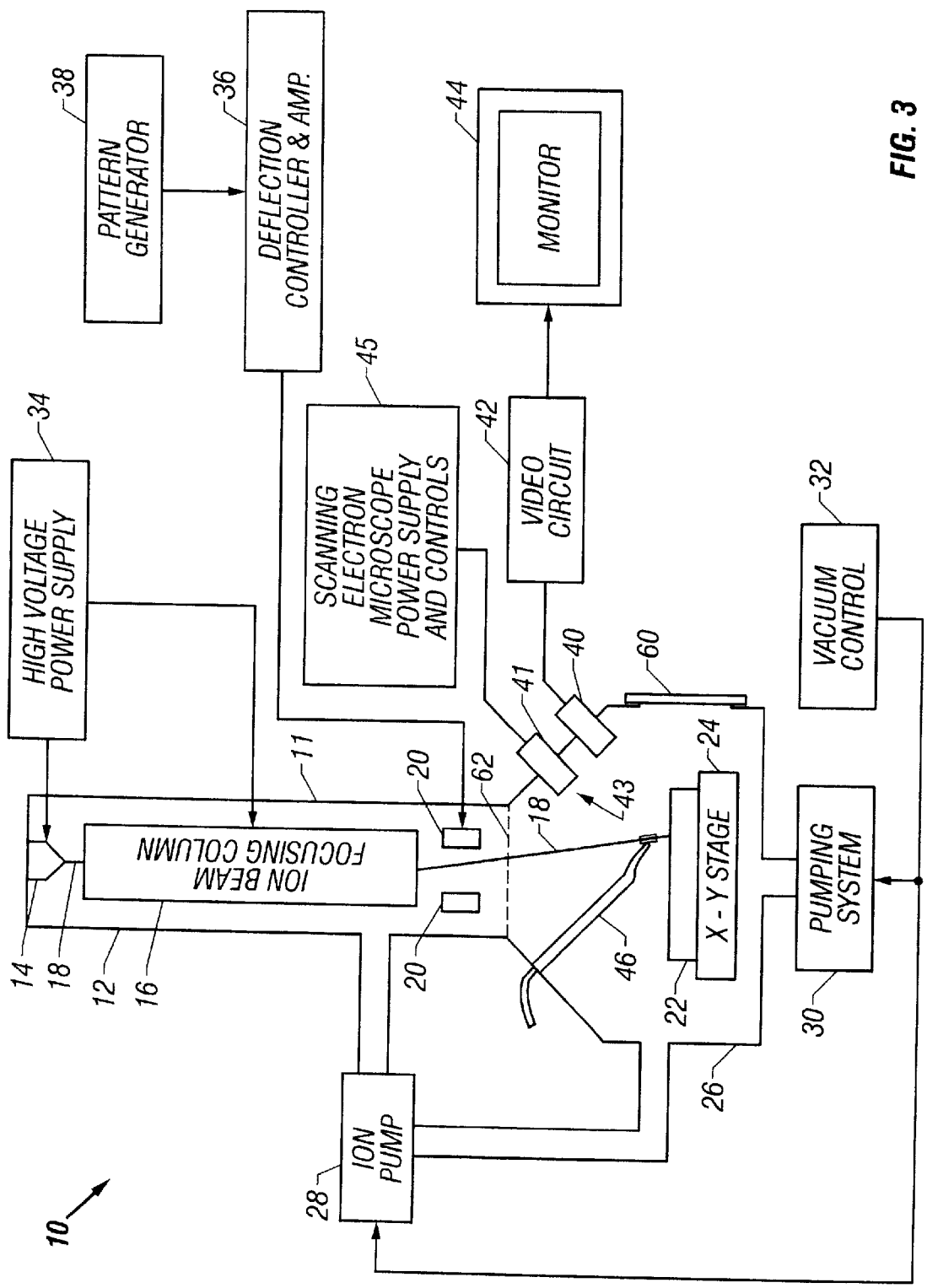
FIG. 3 shows schematically a typical focused ion beam system used in a preferred embodiment of the invention.

FIG. 3 shows a typical focused ion beam system 10 used to implement the present invention. Focused ion beam system 10 includes an evacuated envelope 11 having an upper neck portion 12 within which are located a liquid metal ion source 14 and a focusing column 16 including extractor electrodes and an electrostatic optical system. Ion beam 18 passes from source 14 through column 16 and between electrostatic deflection means schematically indicated at 20 toward sample 22, which comprises, for example, a semiconductor device positioned on movable X-Y stage 24 within lower chamber 26. An ion pump 28 is employed for evacuating neck portion 12. The chamber 26 is evacuated with turbomolecular and mechanical pumping system 30 under the control of vacuum controller 32. The vacuum system provides within chamber 26 a vacuum of between approximately $1\times10^{-7}$ Torr and $5\times10^{-4}$ Torr. If an etch assisting, an etch retarding gas, or a deposition precursor gas is used, the chamber background pressure may rise, typically to about $1\times10^{-5}$ Torr.

High voltage power supply 34 is connected to liquid metal ion source 14 as well as to appropriate electrodes in focusing column 16 for forming an approximately 1 keV to 60 keV ion beam 18 and directing the same downwardly. Deflection controller and amplifier 36, operated in accordance with a prescribed pattern provided by pattern generator 38, is coupled to deflection plates 20 whereby beam 18 may be controlled to trace out a corresponding pattern on the upper surface of sample 22. In some systems the deflection plates are placed before the final lens, as is well known in the art.

The source 14 typically provides a metal ion beam of gallium, although other ion sources, such as a multicusp or other plasma ion source, can be used. The source typically is capable of being focused into a sub one-tenth micron wide beam at sample 22 for either modifying the sample 22 by ion milling, enhanced etch, material deposition, or for the purpose of imaging the sample 22. A charged particle multiplier 40 used for detecting secondary ion or electron emission for imaging is connected to video circuit and amplifier 42, the latter supplying drive for video monitor 44 also receiving deflection signals from controller 36. The location of charged particle multiplier 40 within chamber 26 can vary in different embodiments. For example, a charged particle multiplier 40 can be coaxial with the ion beam and include a hole for allowing the ion beam to pass. A scanning electron microscope 41, along with its power supply and controls 45, are optionally provided with the FIB system 10.

A gas delivery system 46 extends into lower chamber 26 for introducing and directing a gaseous vapor toward sample 22. U.S. Pat. No. 5,851,413 to Casella et al. for "Gas Delivery Systems For Particle Beam Processing," assigned to the assignee of the present invention, describes a suitable fluid delivery system 46. Another gas delivery system is described in U.S. Pat. No. 5,435,850 to Rasmussen for a "Gas Injection System," also assigned to the assignee of the present invention.

A door 60 is opened for inserting sample 22 onto stage 24, which may be heated or cooled, and also for servicing an internal gas supply reservoir, if one is used. The door is interlocked so that it cannot be opened if the system is under vacuum. The high voltage power supply provides an appropriate acceleration voltage to electrodes in ion beam column 16 for energizing and focusing ion beam 18. When it strikes sample 22, material is sputtered, that is physically ejected, from the sample. Focused ion beam systems are commercially available, for example, from FEI Company, Hillsboro, Oreg., the assignee of the present application.

Prior to the description of preferred embodiments of the present invention, a description of the development that led to the present invention is now provided for background. Initially, a study with bulk single crystal specimens of copper, each with a known crystallographic orientation, was conducted to determine the cause of the difference in FIB milling rates of various orientations of copper grains.

Figure 4A:
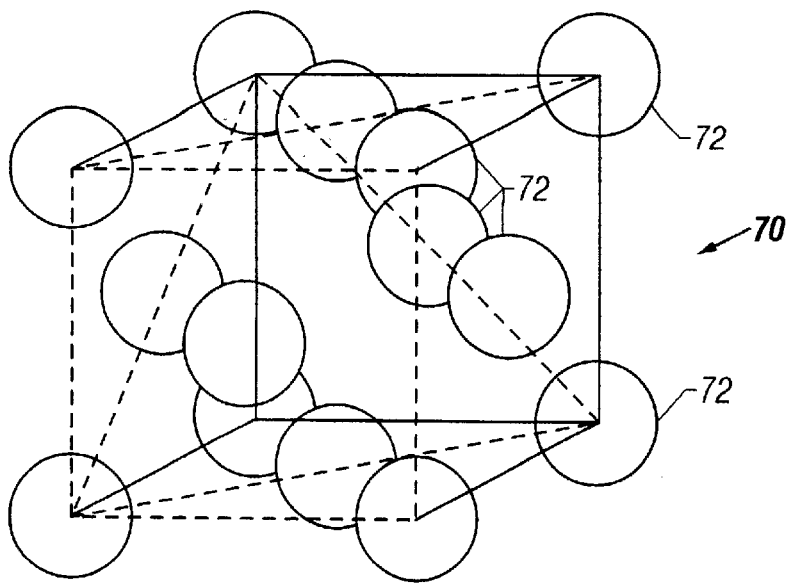
FIG. 4A illustrates the atomic structure for Face Centered Cubic (FCC) copper unit cell.
Figure 4B:
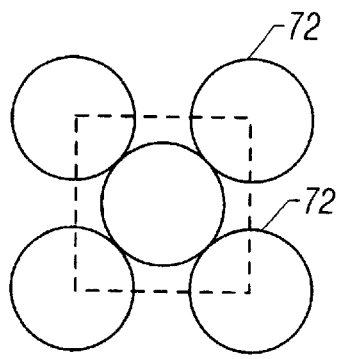
FIGS. 4B through 4D illustrate copper atoms on different atomic planes of three orientations of copper.
Figure 4C:
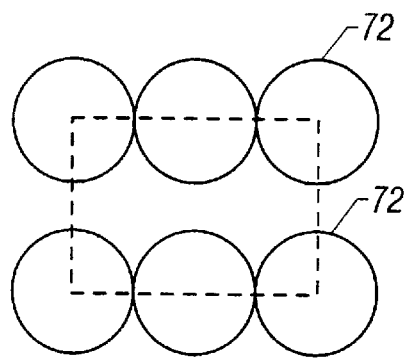
Figure 4D:
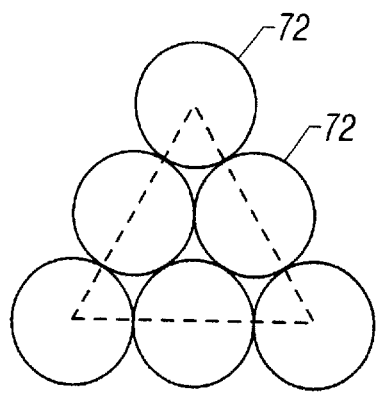

FIG. 4A shows schematically the crystalline structure, normally formed by copper atoms. The structure is base upon a "Face Centered Cubic" (FCC) unit cell 70, where the atoms 72 are grouped as if forming a cube, with an atom 72 at each of eight corners, plus six additional atoms 72, one at the center of each face of the cube. A single grain of copper contains an identical, repetitive array in three dimensions of these unit cells. The unit cell can be orientated in many different directions relative to the observer, or the incident beam of the FIB. Materials scientists frequently refer to a particular orientation in FCC materials by describing the atomic "plane" within the unit cell whose normal vector is parallel to the direction of observation. FIGS. 4B through 4D show the relative locations of atoms on three different planes within the unit cell, these planes being referred to as (100), (110) and (111) respectively. One skilled in the art would understand that these copper grains with different planes have different distributions of atoms, and subsequently different atomic densities.

Among the single crystal copper samples obtained for the study, three of these samples could be oriented such that the (100), (110) and (111) planes, respectively, were normal to the incident ion beam. Next, using standard milling conditions in a FEI Company 2500 FIB system (having a 5 nm resolution FIB column with 50 kV Ga$^+$ ions as the primary beam), experiments were performed where a known dose of gallium ions (5 nC of gallium per square $\mu$m) as delivered over a number of areas, each of 10 $\mu$m×10 $\mu$m on each sample. The resultant depth of milling for this known dose was then measured using the standard FIB technique of sectioning and imaging the specimen. It is noted that a protective layer of FIB deposited tungsten was laid down prior to sectioning to preserve the original surface, following well-known techniques. Results from these experiments are shown in Table 1 below:

TABLE 1

| Trial # | Depth of FIB Crater ($\mu$m) | | |
|---|---|---|---|
| | (111) | (110) | (100) |
| 1 | 2.46 | 0.66 | 1.6 |
| 2 | 2.46 | 0.69 | 1.44 |
| 3 | 2.52 | 0.66 | 1.6 |
| 4 | 2.41 | 0.72 | 1.6 |
| 5 | 2.41 | 0.66 | 1.6 |
| Average | 2.45 | 0.68 | 1.57 |
| Standard Deviation | 0.04 | 0.02 | 0.06 |

Figure 5A:
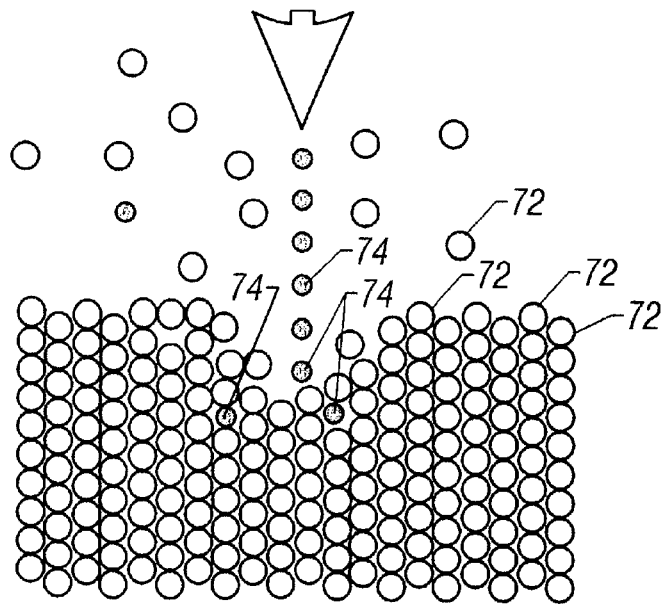
FIGS. 5A and 5B illustrate a FIB milling process into a densely packed crystallographic orientation and a sparsely packed crystallographic orientation respectively.
Figure 5B:
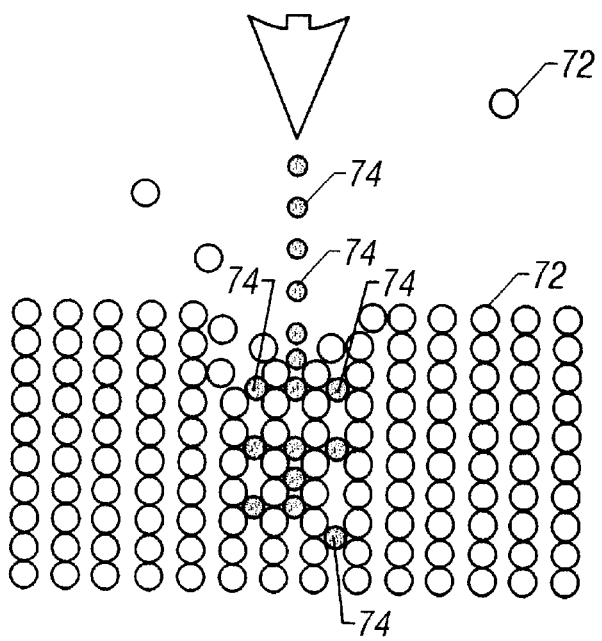

From these experiments, it was determined that a "fast" milling orientation such as (111) mills approximately 3.6 times faster than a "slow" milling orientation such as (110). There are a number of theories that can be generated from this experiment. From a metal physics standpoint, given the relatively "open" lattice in the (110) crystalline structure the densely packed (111) crystalline structure (see FIGS. 4C and 4D the incident ion beam may be "channeling," that is, slipping in between planes of atoms normal to the (110) surface, implanting itself deeper into the copper. Ions that are channeled mill away very little sample material compared to ions that expend their energy knocking into densely packed copper atoms normal to the (111) orientation and thereby mill away these densely packed copper atoms. FIGS. 5A and 5B illustrate schematically this possible phenomenon for the (111) and (110) copper orientations respectively with gallium ions or atoms 74 being implanted among copper atoms 72.

Figure 6:
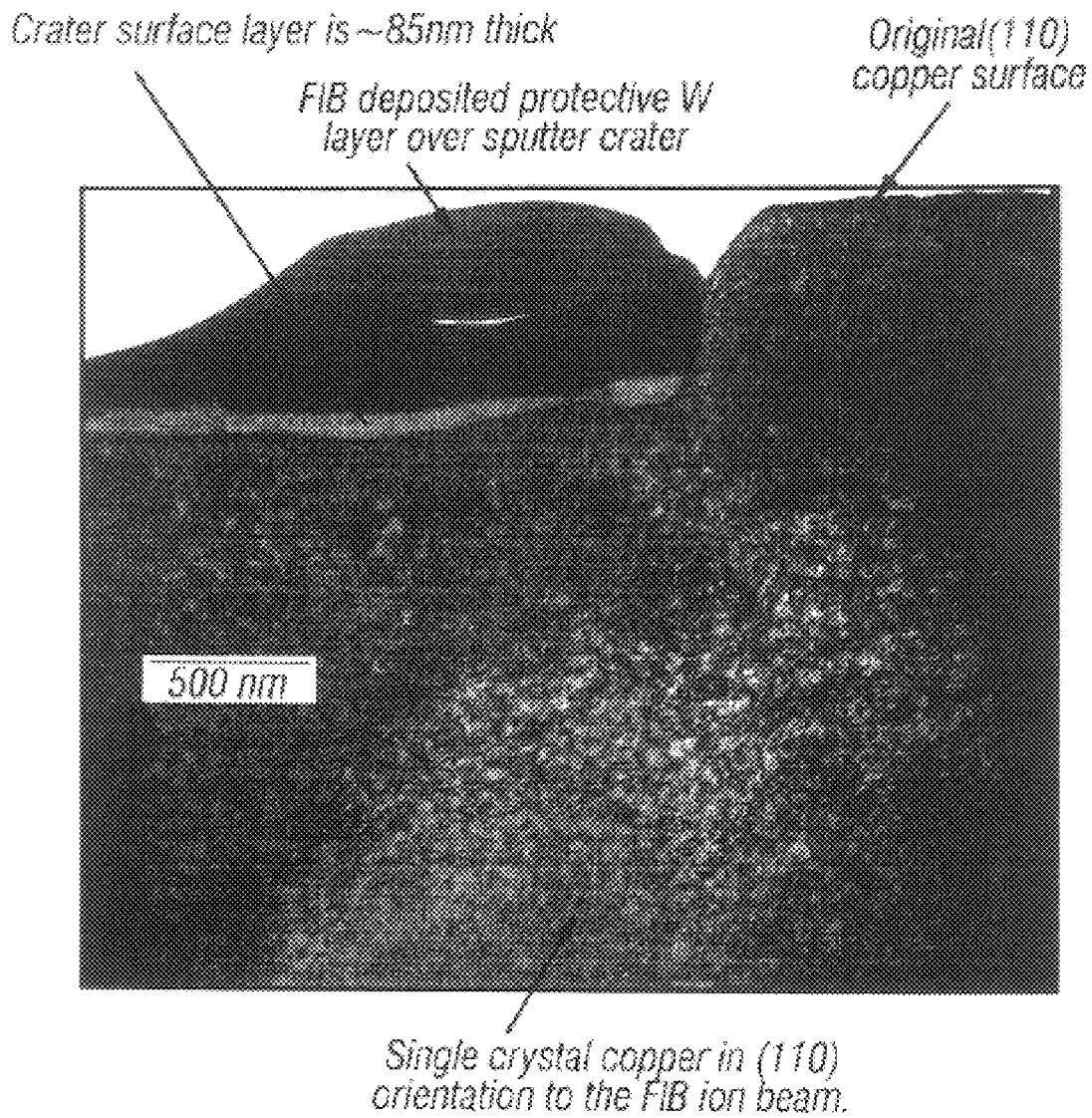
FIG. 6 illustrates a cross-sectional transmission electron microscope (TEM) image of a FIB produced sample through the bottom of a sputter crater in (110) copper.

To investigate this phenomenon further, cross-sectional specimens from the milled regions of the single crystal copper samples were examined under a transmission electron microscope (TEM), one such TEM image for the (110) copper sample being illustrated in FIG. 6. It is noted that the TEM specimens for imaging were prepared by first applying a thin protective layer of gold, typically sputter deposited, and a thicker protective layer of FIB deposited tungsten. The FIB was then used to mill the region of interest until it was thin enough to be transparent to the electrons used in a Philips 200 kV Field Emission CM20 TEM. Techniques for preparing samples for TEM viewing are well known.

Figure 7:
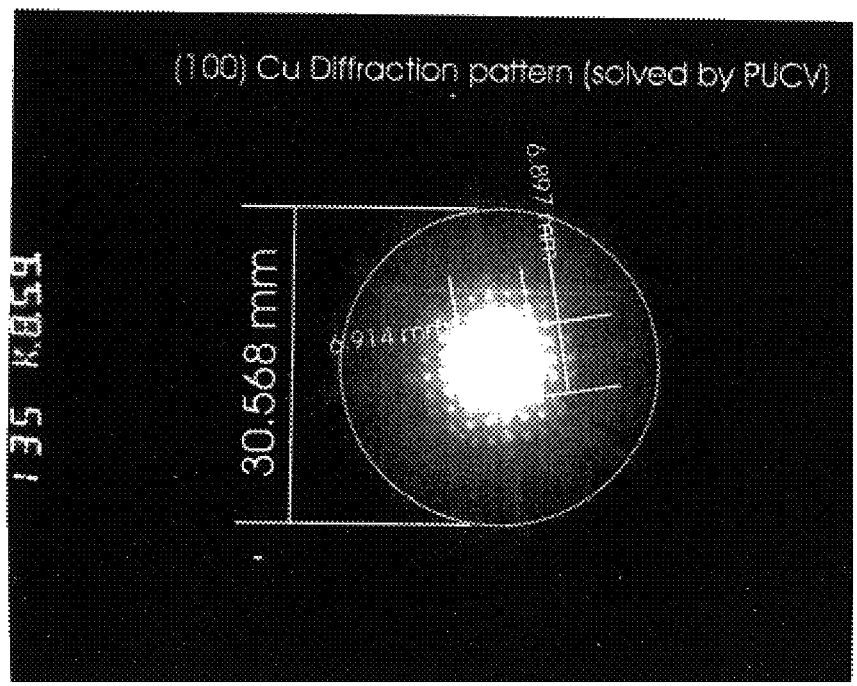
FIG. 7 illustrates a Convergent Beam Electron Diffraction (CBED) pattern from the single crystal substrate in FIG. 6.
Figure 8:
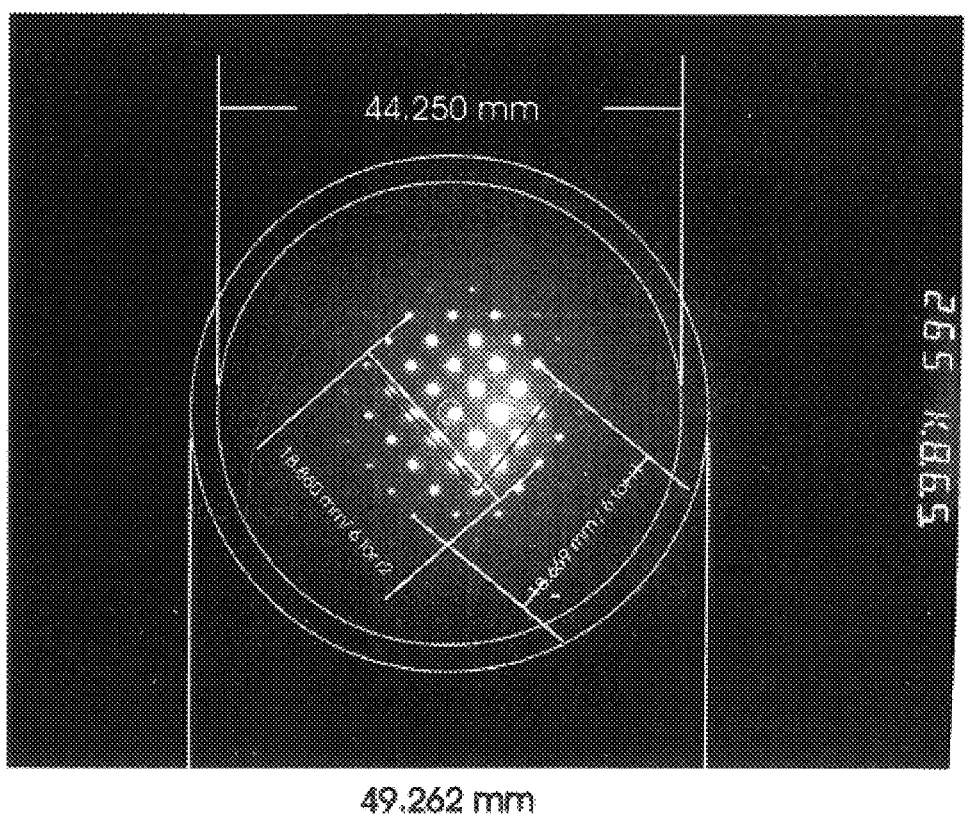
FIG. 8 illustrates a CBED pattern from the gallium rich layer in FIG. 6.

As can be seen in FIG. 6, in the case of the (110) copper, a layer, approximately 85 nm thick, of copper material rich in gallium was found at the surface of the sputter crater. Next, the electron beam in the TEM was focused to a fine spot and Convergent Beam Electron Diffraction (CBED) patterns were obtained from the substrate copper and the gallium rich layer at the crater surface. Standard techniques to identify these diffraction patterns confirmed that the substrate material was copper as shown in FIG. 7, and revealed the unknown surface layer to be a copper-gallium intermetallic phase with the composition of $Cu_3Ga$ as shown in FIG. 8. In FIG. 8, the angle between the axes is 80.2 degrees, the spacing between spots along axis r1 is 18.669 mm divided by 6, or 3.112 mm, and spacing along the r2 is 18.860/6 mm or 3.143 mm. The crystallographic parameters of this phase can be obtained by searching the Joint Committee on Powder Diffraction Standards (JCPDS) powder diffraction database for compounds containing copper and gallium, and correspond with the description of $Cu_3Ga$ found on JCPDS powder diffraction file PDF 44-1117. With this TEM image it seems that not only was the (110) copper crystal slow to mill because of channeling, but also enough gallium was implanting into the sample to transform the surface of the crater to $Cu_3Ga$, which resists sputtering and forms etch resistant regions.

Figure 9:
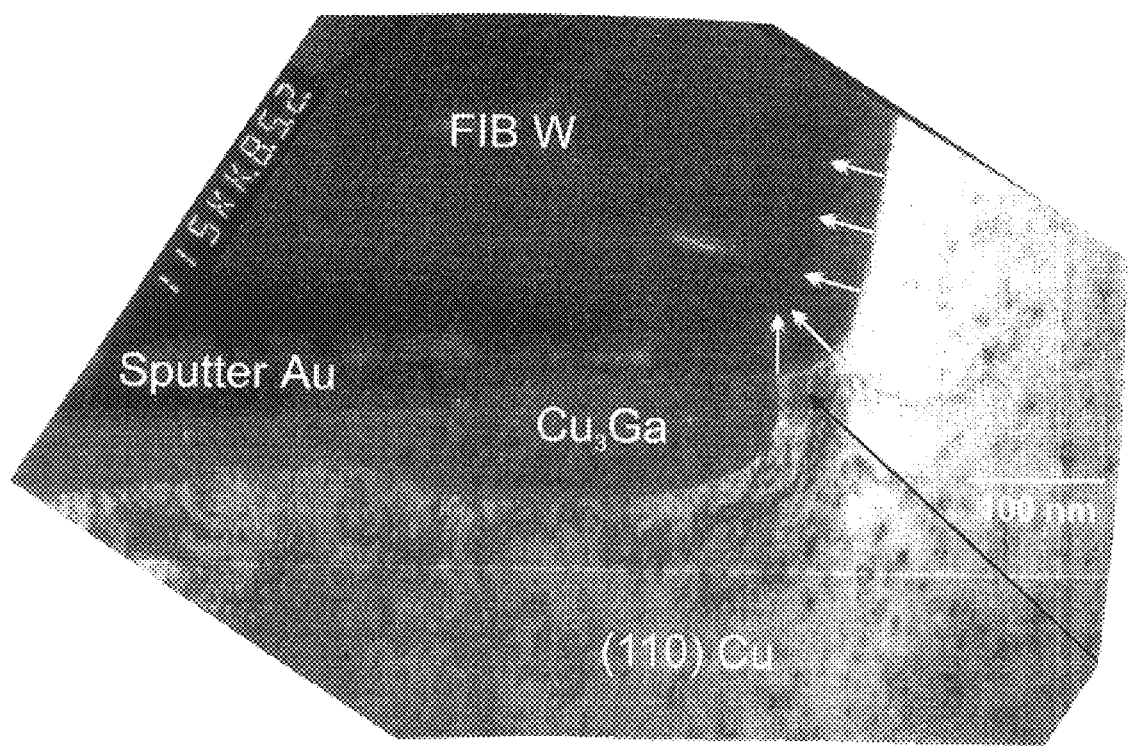
FIG. 9 illustrates a small scale cross-sectional TEM image of the sample of FIG. 6.

After further examination of the edge of the sputter crater in the TEM, it was determined that the $Cu_3Ga$ phase was not evident until the normal to the surface of the crater became very close to parallel to the incident ion beam. This effect is illustrated by the white arrows in the TEM image of FIG. 9, FIG. 9 being a high magnification TEM image of FIG. 6. The black arrow in FIG. 9 show where the Cu—Ga intermetallic formation is suppressed at edge of crater, where orientation of surface normal to beam deviates from (110). From this experiment, it was theorized that the $Cu_3Ga$ phase is only produced when the incident ion beam was effectively parallel to the (110) surface normal. As discussed previously, these are the same conditions where substantial channeling would be expected into the pure copper. The "Sputter Au" layer shown in FIG. 9 is the sputter-deposited gold layer used to prepare the TEM sample, and similarly the "FIB W" is the FIB deposited protective tungsten layer used to prepare the TEM sample.

In summary, the difficulty with sputtering of copper is that, depending on the crystallographic orientation of the copper, the rate of removal of material for a given dose of gallium ions can vary by at least a factor of 3.6. Thus, because a copper conductor is typically made up of many crystal grains having random orientations, it was thought to be necessary to remove the crystallographic effect in order to produce more uniform sputter rates. One possible solution to accomplish this would be to disturb the surface of the grains sufficiently that they lose all of their crystallographic order. Another solution would be to send the incident beam down to the crystalline structure such that each ion in the beam came from a "random" direction. Since, for an FIB microsurgery implementation, tilting the sample to a different orientation for each incident ion or tilting the beam to a new, random angle for each incident ion is not practical, another solution was required.

Preferred embodiments of the present invention, as will be discussed herein below, comprise techniques for reducing the difference in sputter rates between grains of different crystallographic orientations. With the basis of the above described analysis, it was determined that the dynamic deposition of a thin layer could eliminate the non-uniform milling. The layer is preferably an essentially amorphous, nanocrystalline, or fine-grained layer that is sufficiently dense material to meet one of two criteria. First, the layer preferably should be such that it can be driven into the substrate lattice by the ion beam, thus disrupting the lattice sufficiently to provide an effectively "random" crystallographic texture for each incident ion. Secondly, the layer preferably should deflect incoming ions prior to their hitting the substrate, by relatively random angles, such that the resulting direction of each ion would be varied compared to the ion before; the deflections effectively giving each grain a different orientation relative to each incident ion.

Figure 10:
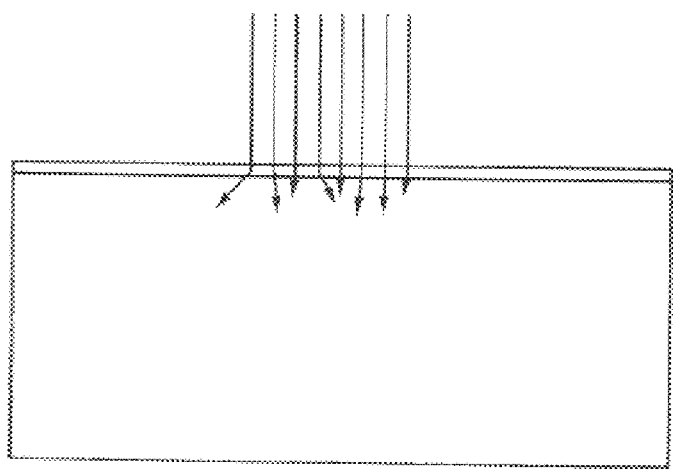
FIG. 10 illustrates a cross-sectional view of a crystal having a dechanneling layer according to the preferred embodiment of the present invention.

The approach of using an additional layer, as will be described in specific examples below, is hereinafter referred to as the dynamic production of a sacrificial layer. The sacrificial layer is thought to reduce or eliminate the effect of the crystal structure on FIB milling of the substrate by deflecting the incoming ions so as to change the angle of incidence between the ions and the substrate atoms and by disrupting the crystal structure of the substrate as the ion beam drives atoms of the sacrificial layer into the substrate structure. Which of these mechanisms predominates will vary with the particular application. FIG. 10 shows a plurality of ions colliding with the sacrificial layer, resulting in these ions being deflected into a copper substrate at random angles.

The sacrificial layer is preferably sufficiently thin to allow a large number of ions in the primary beam to pass through the layer and sputter away the substrate material. The sacrificial layer is also sufficiently thin to allow the sputtered substrate material to leave the surface without immediately destroying the sacrificial layer. As the ion beam dwells at a particular pixel, the sacrificial layer is eventually removed, being gradually eroded by sputtering and by being mixed into the substrate material, which is then sputtered. The sacrificial layer is then reapplied before or during the next dwell period.

In one preferred embodiment, as will be described in a specific implementation below, a tungsten hexacarbonyl gas delivery system is used to deliver a precursor gas that decomposes to form the sacrificial layer. To generate this sacrificial layer, the parameters of gas pressure, ion beam dwell time, ion beam refresh time (that is, the time between successive dwells at the same pixel), ion beam current, pixel size and pixel spacing are selected so that, rather than building up a layer of deposited tungsten hexacarbonyl as conventionally occurs, just a thin layer of precursor gas is allowed to be adsorbed at the surface of the copper layer before the ion beam converts the gas into a tungsten based sacrificial layer by driving off some of the carbonyl compounds. This conversion leaves FIB deposited tungsten that is a fine grained, possibly with some gallium and carbon incorporated. After the conversion, the ion beam further sputters away the thin tungsten layer, along with the underlying copper or other material. Preferably, there would be a sufficient quantity of tungsten hexacarbonyl gas present at a location each time the ion beam makes a pass such that the deposited tungsten layer would be sufficiently thick to persist throughout the time the ion beam dwelled at the particular location, but not so thick that it would substantially prevent the ion beam from penetrating through to the copper layer below or prevent sputter removal of the copper. The layer should also not be so thick that significant quantities are left on the copper so as to cause an ongoing accumulation of tungsten.

Figure 17:
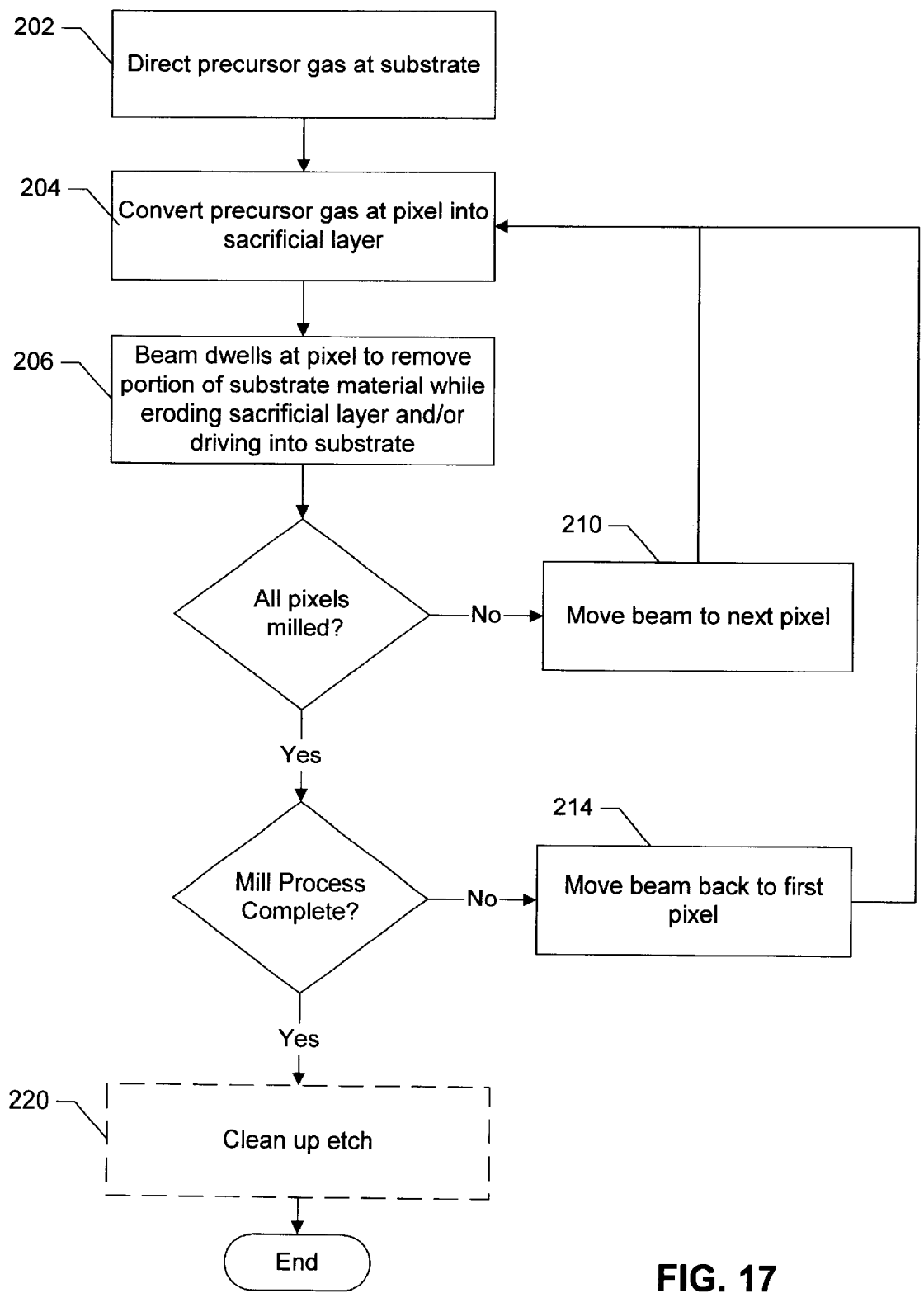
FIG. 17 is a flowchart of a preferred implementation of the dynamic sacrificial layer technique of the invention.

FIG. 17 is a flow chart showing the steps of a preferred implementation of the dynamic sacrificial layer technique. In step 202, a precursor gas is directed toward a substrate. In step, 204, an ion beam is directed to a dwell point or pixel and decomposes the precursor gas to form the sacrificial layer at that pixel. In step 206, the ion beam dwells at the pixel location, sputtering substrate material and eroding the sacrificial layer until the sacrificial layer is substantially eliminated. Unless the pixel just milled was the last pixel of the ion beam scan, the ion beam moves in step 210 to the next pixel in the scan and repeats steps 204 and 206. Step 202 is preferably continuous, that is, the precursor gas is continuously directed to surface, so that precursor gas molecules are accumulating on the substrate surface at pixels when the ion beam is not directed toward them.

If all the pixels in the current scan area have been visited by the ion beam during the current scan, but the removal process is not complete, the beam moves in step 214 back to the first pixel in the scan, performing steps 204 and 206 again at each pixel. Completion of the removal process can be determined, for example, by delivery of a pre-specified ion dose to the scan area, by a change in the material being sputtered, visually, or by other end-point determination methods. By the time the ion beam returns to an individual pixel for a subsequent dwell period, sufficient precursor gas has accumulated to form another sacrificial layer in repeated step 204. As shown by the recurring steps 204 and 206, the sacrificial layer is being created and destroyed repeatedly as the substrate material is being etched. Step 220 is an optional clean-up etch, in which any residual sacrificial layer can be removed. Step 220 can entail the use of an etch-assisting gas. Selective etch retarding gases can also be used in earlier steps to reduce over etching of the substrate under the material intended to be removed.

One particular example of a set of procedures according to the present invention and predetermined parameters that can be used to successfully sputter copper with relative uniformity are now described. Initially for this procedure, a semiconductor component with copper metallizations is placed in a FIB system with a gallium ion beam accelerated to 50 kV, being tuned to a 672 pA beam current using a 150 um aperture and being aligned using standard procedures. The base pressure in the FIB chamber starts in the order of $1\times10^{-7}$ Torr. Subsequently, a 10 $\mu$m×10 $\mu$m region of copper metallization is selected and exposed using standard procedures. Next, a tungsten hexacarbonyl gas nozzle is inserted and, by opening the nozzle valve, the pressure in the chamber is raised to about $1\times10^{-5}$ Torr using standard procedures.

In software, a "mill box" is prepared to cut the copper using a spacing between subsequent pixels in the box of 0.01 $\mu$m in both "x" and "y" dimensions, and a dwell time for the beam of 2 $\mu$sec. At this point the minimum refresh and retrace times are set at the default value of 10 $\mu$s and, for this particular example, the box should be set for a total dose of 2 nC/$\mu$m$^2$ to cut approximately 0.75 $\mu$m deep.

Figure 11A:
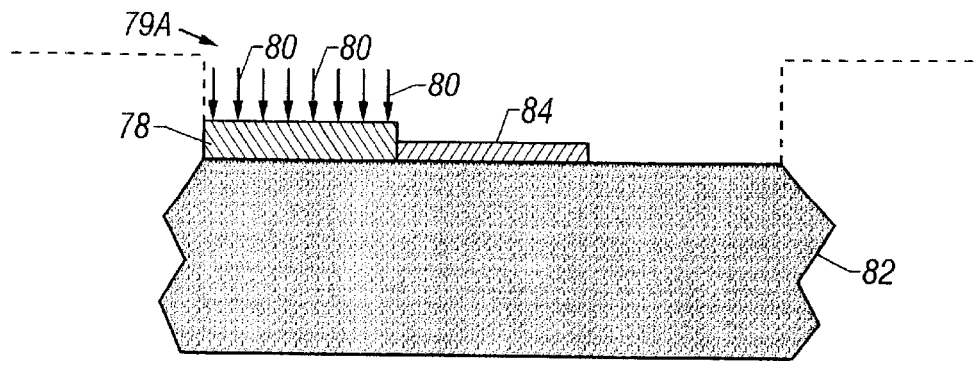
FIGS. 11A through 11P illustrate cross-sectional views of a copper crystalline structure at various stages within a sputtering operation according to a preferred embodiment of the present invention.
Figure 11B:
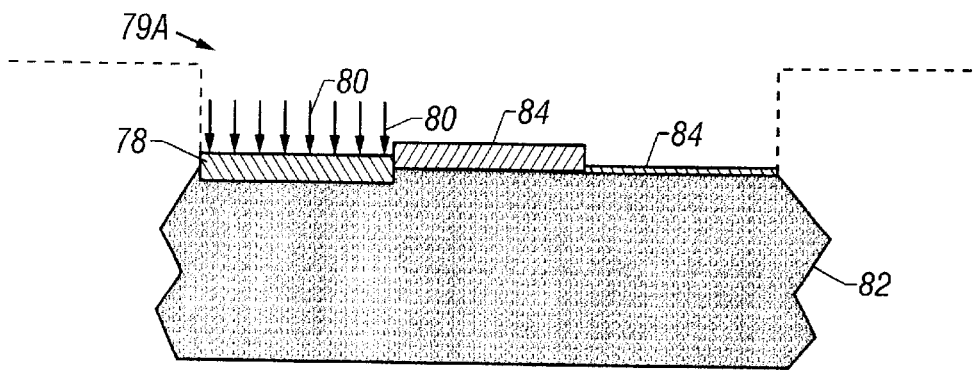
Figure 11C:
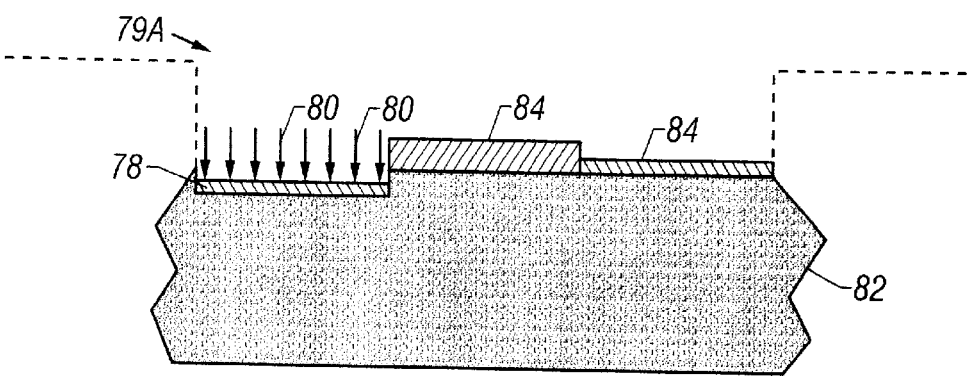

After all the preliminary preparations are complete, the mill is initiated. During this procedure, the tungsten hexacarbonyl gas is continuously flowing onto the exposed copper surface. Control software run on the FIB system positions the ion beam onto the "x=0, y=0" pixel and leaves it there for 2 $\mu$sec, that being the dwell time. This can be illustrated in the cross-sectional views of FIGS. 11A through 11C (though these cross-sections illustrates the sputtering after a portion of the underlying material has already been removed). FIGS. 11A through 11P are not drawn to scale. During the first fraction of this dwell time, the ion beam converts the adsorbed tungsten hexacarbonyl gas to a tungsten based crystalline structure 78 at a dwell point or pixel 79A. As the tungsten layer is being deposited and after the precursor gas is exhausted, individual ions 80 are interacting with the tungsten layer to enhance etching of the underlying copper layer 82.

Figure 11D:
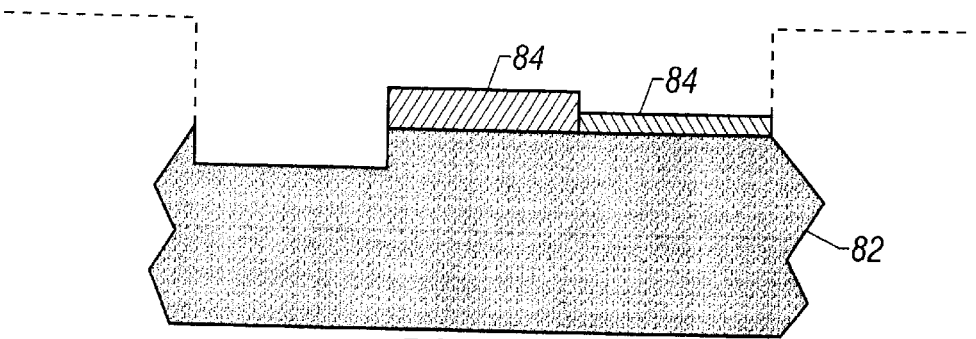
Figure 11E:
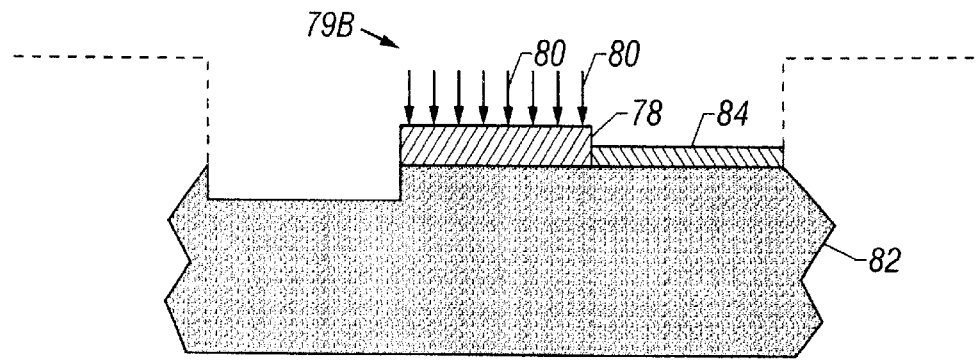
Figure 11F:
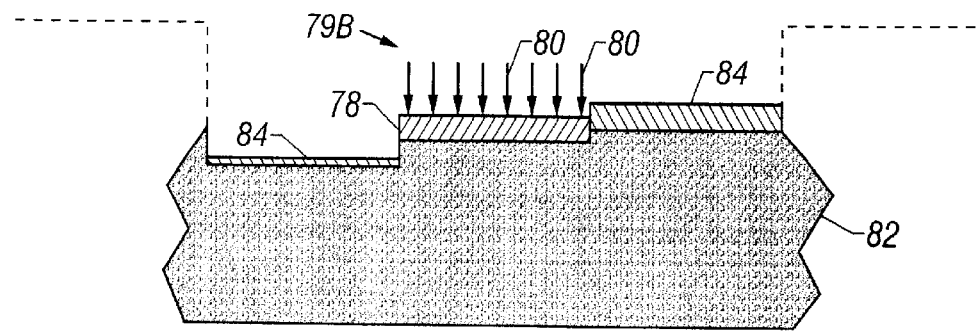
Figure 11G:
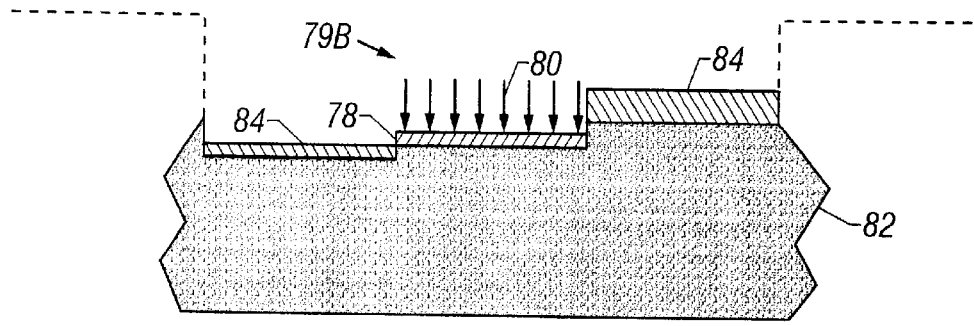
Figure 11H:
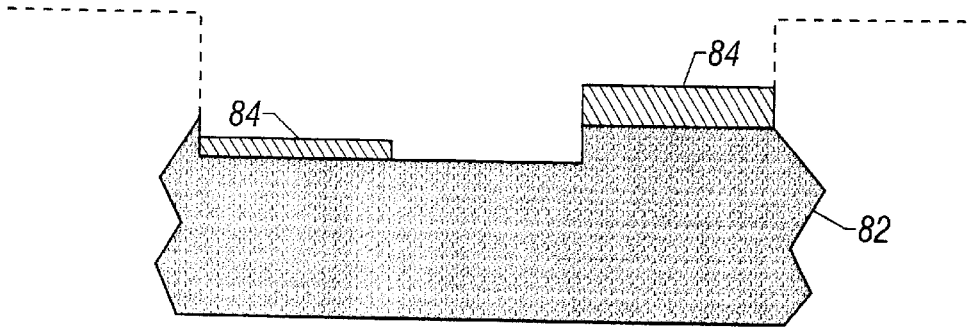
Figure 11I:
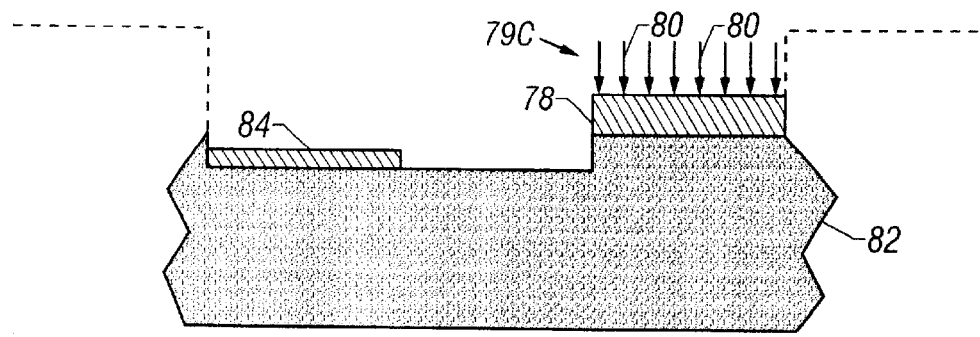
Figure 11J:
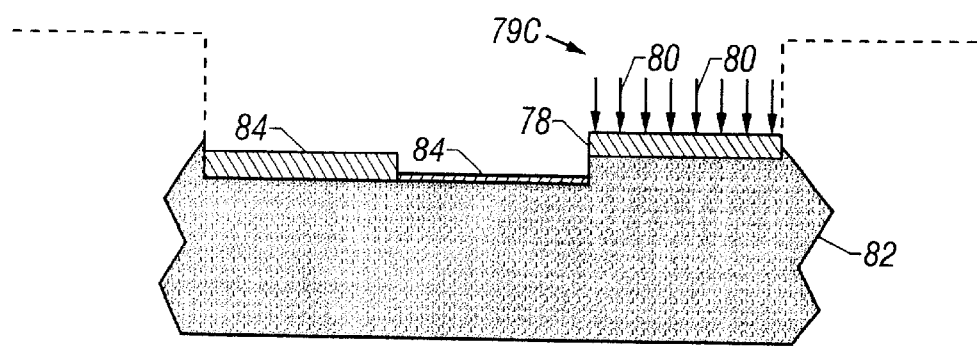
Figure 11K:
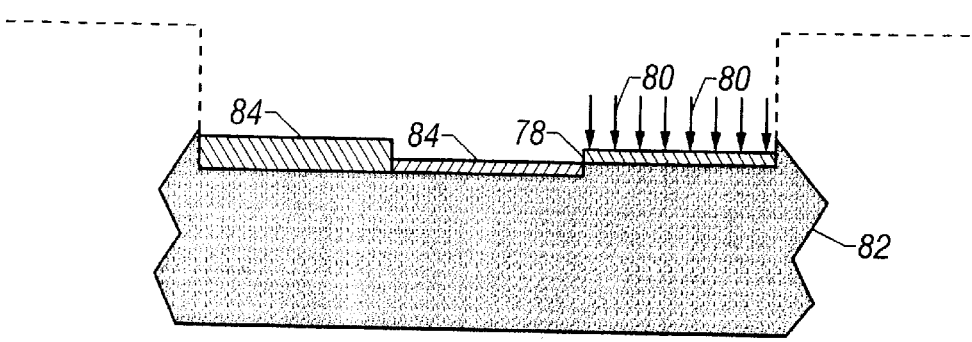
Figure 11L:
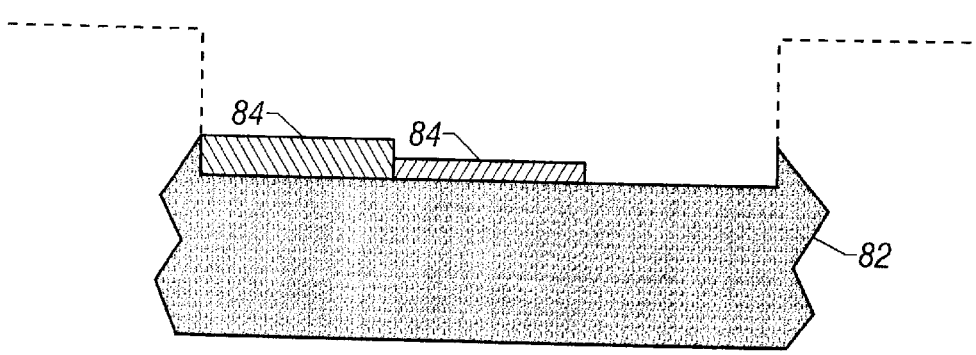
Figure 11M:
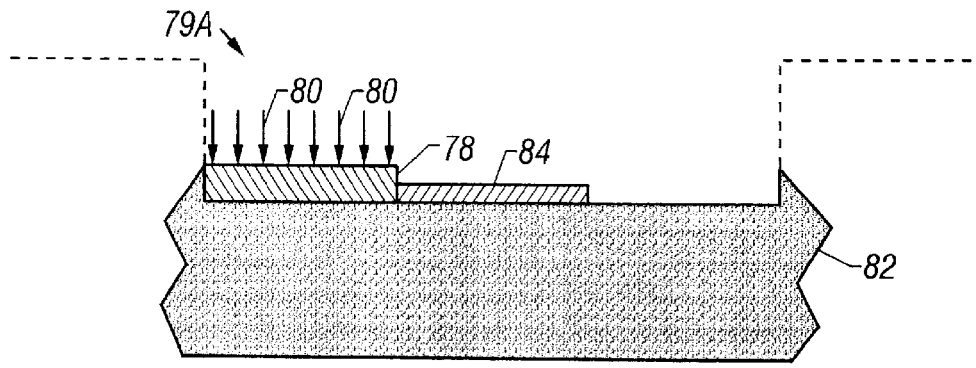
Figure 11N:
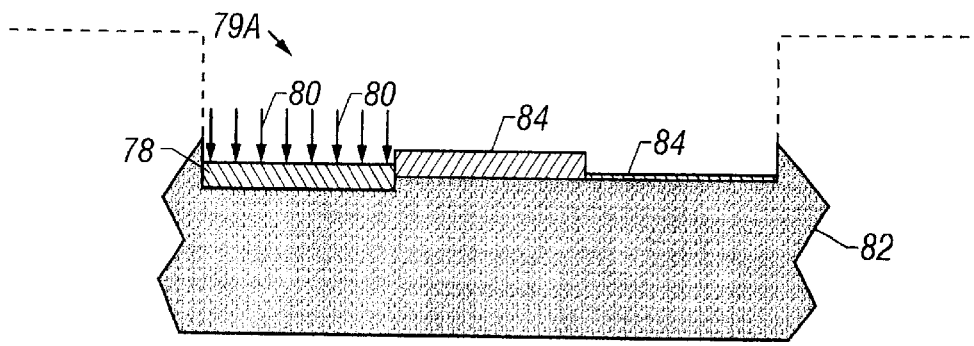
Figure 11O:
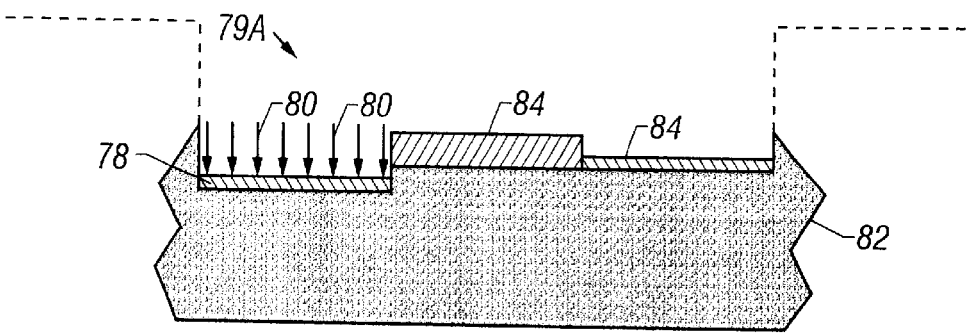
Figure 11P:
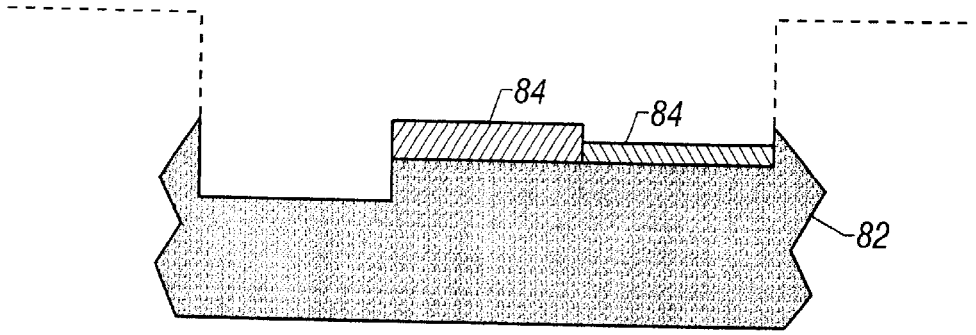

Eventually, as seen in FIGS. 11A through 11D, the tungsten layer 78 is sputtered away along with copper material that the deflected ions collide with. In areas of copper 82 not under bombardment of ions 80, that is, areas other than pixel 79A, tungsten hexacarbonyl precursor gas 84 is being adsorbed onto the surface. Ideally, when the dwell time is complete, there is no tungsten remaining on the surface of the copper at pixel 79A as shown in FIG. 11D. After the 2 $\mu$s dwell time expires, the control software moves to the next pixel and once again dwells for 2 $\mu$s at pixel point 79B as shown in FIGS. 11E through 11H. The result is identical to that described above for this pixel, as well as the dwell time of the third pixel 79C illustrated in FIGS. 11I through 11L.

This step-dwell-step-dwell process continues until all pixels in the mill box have been visited by the beam, whereupon the process starts over with the beam once more directed to the first pixel 79A (x=0, y=0) as can be seen in FIGS. 11M through 11P. Although FIGS. 11A–11P show material being removed evenly across the pixel, skilled persons will recognize that the current density within the ion beam, and therefore the actual etching profile, is typically Gaussian shaped. Also, although FIGS. 11A–11P show pixels as contiguous and non-overlapping, skilled persons will recognize that pixels spacing is typically less than the beam diameter, so adjacent pixels overlap. As described in more detail below, it is preferable in some embodiments to use pixels that are spaced apart further than the beam diameter. As discussed above, in this example implementation, the tungsten hexacarbonyl gas continuously is being applied to the surface of the exposed copper and so, by the time the ion beam returns to the first pixel, a new layer 84 of tungsten hexacarbonyl has adhered to the target surface at the pixel. Any tungsten hexacarbonyl remaining on the sample surface when milling is complete will not result in tungsten deposition because the decomposition to tungsten occurs only during ion beam bombardment.

In this implementation, while the beam is dwelling at each point, copper is being sputtered away as discussed above. This sputtered material contains particles that may be detected, either using the standard detectors in the FIB system, a detector specifically designed for the purpose, or a signal not based on detected particles but another phenomena such as the electrical current conducted through the sample. By examining the signal from a detector, correlated with the known beam position at that point in time, it is possible to view a virtual "image" of the process. Analyzing this image visually, or performing some other analysis of the signal permits "endpoint determination"; that is to say, determining when all the copper has been removed from the vicinity of the mill box, exposing the underlying dielectric layer.

Copper conductors in integrated circuits are typically surrounded by a thin liner to prevent copper atoms from randomly diffusing throughout the substrate. The liner may comprise, for example, a material including tantalum or tungsten. The introduction of tungsten hexacarbonyl gas during FIB processing etching inhibits the etching of the tantalum-containing or tungsten-containing liner. Thus, the application of tungsten hexacarbonyl to deposit the sacrificial layer not only enhances the milling of copper, it inhibits the milling of the underlying liner, thereby reducing the likelihood of milling deeper than desired. After the copper conductor is removed, the liner and any residual deposited tungsten can be readily removed by a quick gas-assisted FIB etch using xenon difluoride.

A standard FIB system provides a method to determine "how much" ion beam has been delivered to a particular site, this "how much" value hereinafter being referred to as the dose. One can either decide to stop the milling procedure at a given dose, when a sufficient end-point signal has been detected or a combination of the two. Once milling has been completed, the gas flow is stopped, and the chamber pressure allowed to return to a value nearer its base pressure. Correct application of the technique described above will result in a flat bottomed crater with little or no evidence that differential sputtering on a grain-by-grain basis has occurred.

Figure 12A:
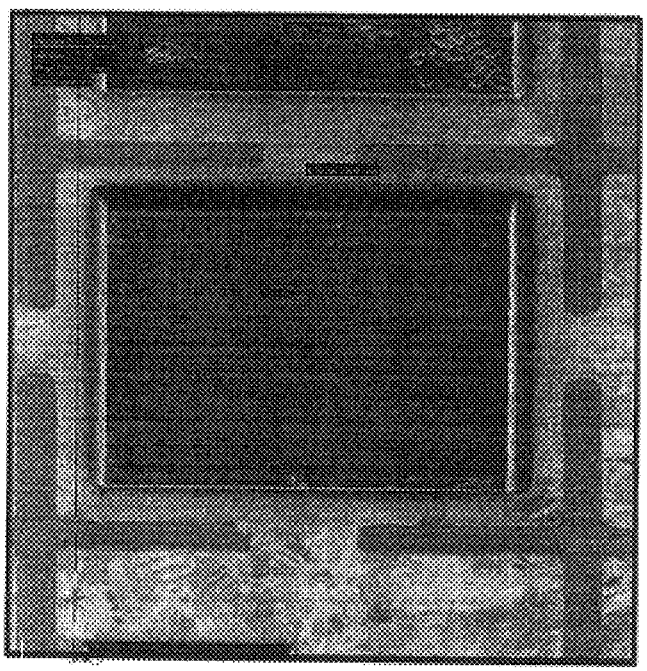
FIGS. 12A and 12B illustrate two samples of FIB microsurgery according to preferred embodiments of the present invention for polycrystalline copper samples.
Figure 12B:
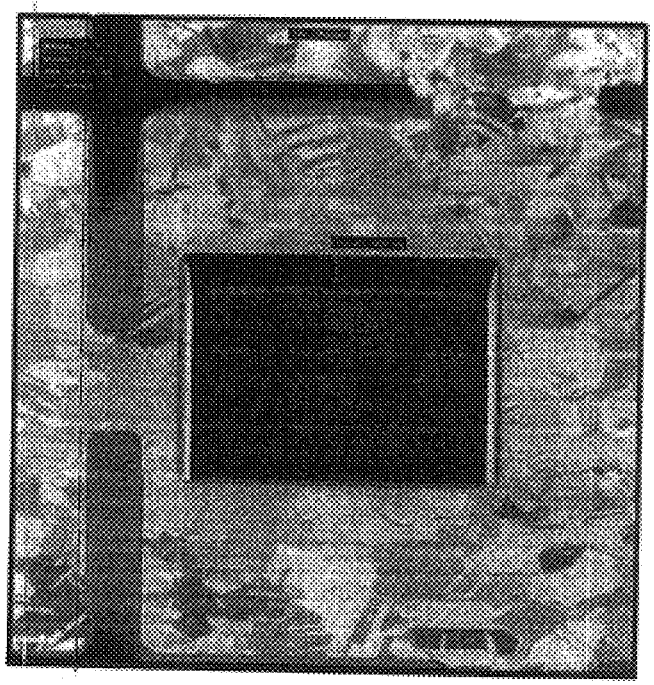

The above sample procedure was generated by experiments to optimize conditions on single crystal samples. Using this technique and conventional milling, the depths of sputter for a given dose ranged from a slow sputtering (110) at 0.68 $\mu$m depth and fast sputtering (111) at 2.45 $\mu$m depth. When the sacrificial layer technique was used, the depth of sputtering was uniform, approximately 1.8 $\mu$m depth for both (111) and (110) crystallographic orientations. Further experiments were performed on polycrystalline copper semiconductor devices from a commercial manufacturer and high quality results, in terms of relative uniform removal of a number of copper grains, were obtained. FIGS. 12A and 12B illustrates two such test craters.

As mentioned, the above description is for a specific implementation and it should be understood that the adjusting or "tweaking" of parameters to other systems and circumstances may be required to apply the method of the preferred embodiment successfully to a separate example. For instance, it was found that when using a FEI Company/Micrion 9500 FIB system equipped with a special power supply that generates approximately 2,000 pA of beam current using the 150 $\mu$m aperture, the default gas settings did not raise the chamber pressure to the required $1 \times 10^{-5}$ Torr, but rather $7 \times 10^{-6}$ Torr. Attempting to use identical parameters as those described above resulted in differential sputtering and, as a result, some grains of copper were not removed cleanly while others were. It was theorized that the higher beam currents and lower gas pressure resulted in a consumption of the sacrificial tungsten-based layer too quickly. This problem was rectified by reducing the dwell time from 2 $\mu$sec to approximately 0.2 $\mu$sec and increasing the pixel spacing from 0.01 $\mu$m to 0.05 $\mu$m.

The key parameters when using a FIB system can be considered the current density which includes the ion beam current and the pixel size as variables; the application rate of the sacrificial layer which is based upon the gas pressure; the dwell time; and the refresh time. Experiments have shown the technique of preferred embodiments of the present invention can be optimized to give relatively uniform removal of copper grains regardless of orientation over a range of typical instrument operating parameters. Though, it should be noted that other systems that are capable of performing the method of the present invention could use parameter values that are greater than or less than these parameters and so the present invention should not be limited to these cases.

There are a number of undesirable situations that can occur in cases that the parameters are not optimized. For instance, the sacrificial layer, such as deposited tungsten, could accumulate over time if not all of the tungsten is sputtered during the dwell time. This accumulation could eventually cause a build up to such a thickness that none of the underlying material is removed, as the ions are not simply deflected, but essentially blocked from reaching the bottom layer. In this case, a higher beam current, a longer dwell time, a shorter refresh time, or a reduced gas pressure could be employed, for example, to slow the rate of deposition. One skilled in the art, after observing a particular deviation from the desired uniform milling rate, should be capable of readily adjusting his/her parameters to achieve the desired result.

Other undesirable situations that occurred in some experiments with the present invention indicate that further changes to the standard milling algorithm may be required in some circumstances. For example, in certain experiments, while the copper was removed cleanly and uniformly across the crater, right at the edge of the crater walls, an excess of copper was removed, resulting in some "troughing" at the edges. Creation of such a trough can be prevented by modifying the dose that is applied near the edges of the crater.

Yet another undesirable situation may occur if the sacrificial layer is formed from conductive metal deposited from a precursor gas such as tungsten hexacarbonyl as described above. In this case, even if the precursor decomposition products are substantially removed, some residual conductive material may be left at the end of the mill process, possibly resulting in short circuits within the device. This residue could remain from within the areas in which the milling took place and could also be generated with the sputtering off at one site possibly ricocheting and subsequently converting the tungsten hexacarbonyl in another area to tungsten even before the primary beam of gallium ions is received. One possible solution is to use standard clean-up procedures already well-known in the art such as a quick cleaning mill with $XeF_2$.

Yet another undesirable situation that can occur is continuing to mill past the bottom the crystalline material over part or all of the area being milled. Depending upon the material beings milled and the material located below the material being milled, it is sometimes possible to introduce a gas, typically near the end of the milling process, that selectively inhibits the etching of the material below the material being milled. For example, when milling a copper material positioned on a dielectric material, such as a silicon oxide, an oxygen containing gas, such as water vapor or oxygen, can be introduced to selectively inhibit the etching of the oxide layer over the copper material, thereby promoting a smooth floor to the milled area. The use of water vapor in focused ion beam etching is described in U.S. Pat. No. 5,958,799 to Russell, et al. for "Method for Water Vapor Enhanced Charged-Particle-Beam Machining." Also, as described above, tungsten hexacarbonyl, a precursor gas that can be used to deposit a sacrificial layer, inhibits the etching of some materials used for liners around copper conductors.

Another undesirable situation occurs when residue from the sputtering process remains or is redeposited onto the substrate. For example, copper or other conductive material that is sputtered from one area of a substrate can redeposit elsewhere on the substrate. The conductive material can then provide a conductive path where none should exist, causing an undesirable "leakage current" in electrical devices on an integrated circuit. This problem can be reduced or eliminated by introducing "de-conductive" atoms or molecules that interact with the sputtered material to reduce its electrical conductivity, thereby reducing the current leakage paths created. This de-conductive material could comprise, for example, water vapour, oxygen molecules, and/or other oxidizing agents. The use of a de-conductive material is of particularly useful in high aspect ratio holes, that is, hole that are relatively deep and narrow, because of the tendency of sputtered material to redeposit onto the sides of such holes.

It should be recognized that one could replace tungsten deposition from tungsten hexacarbonyl gas, as is described above, for another gas that has sufficient properties to allow, once being deposited and projected with an ion beam, to deflect ions and/or disrupt the copper array. Some examples of replacements, that are not meant to be limiting, include many metalorganic gases such as platinum-based and gold-based molecules; silicon and oxygen based molecules such as siloxane and oxygen which can be used to produce a silicon dioxide layer on the surface; and even a non-solid could possibly be used such as a noble gas. For each of these new sacrificial layer substances a new set of parameters based on experimentation would be required to find the optimal conditions for the sputtering.

Figure 13:
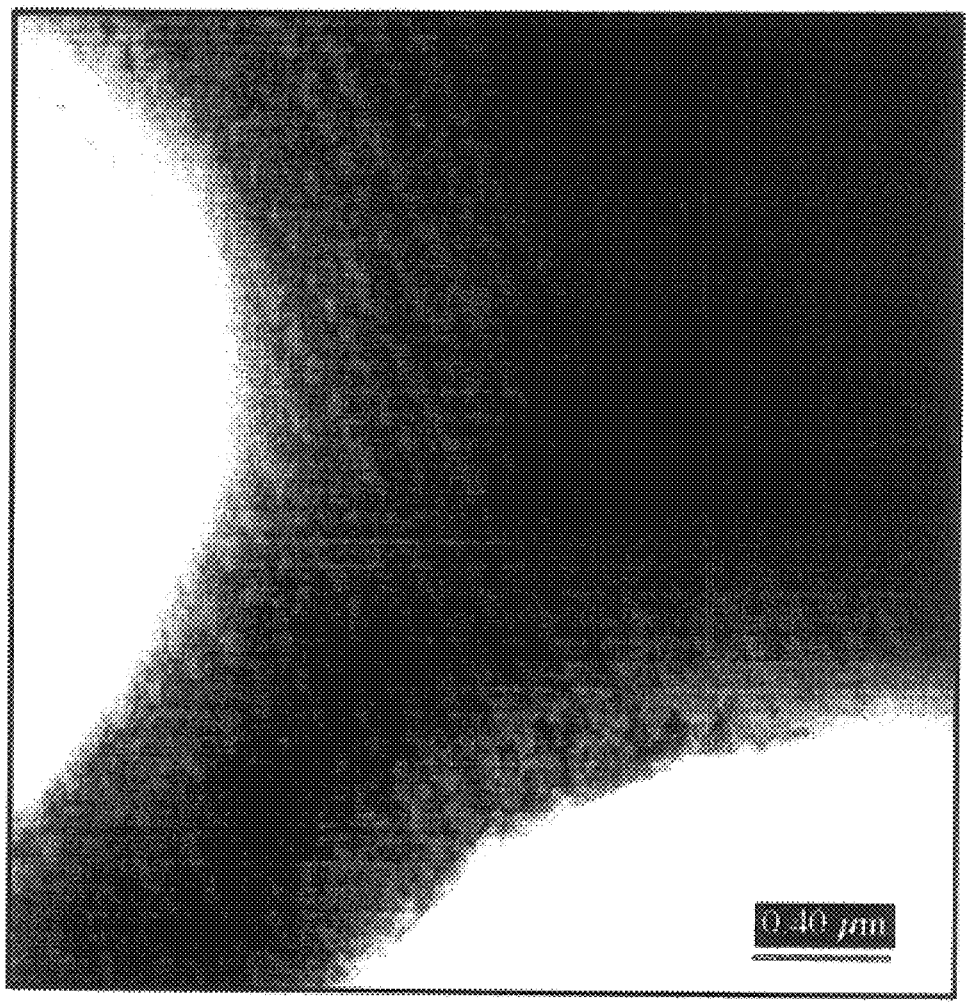
FIG. 13 illustrates a TEM image of an array of disrupted spots formed by a FIB.

Another approach to achieving uniform removal is to alter the morphology near the surface of the substrate. "Morphology" is used to include both the form and structure of the surface material, including the arrangement of the atoms, such as in a crystal structure, and the shape or topography of the material. This approach can be used with or without the sacrificial layer technique described above. For example, the morphology of the copper can be altered at regular intervals by "damaging" the copper so as to disrupt the regular array of lattice planes, hence reducing the effects of channeling. This approach comprises creating an array of disrupted regions using the ion beam to create very small depressions each surrounded by implantation damage. Another approach to reduce the problem of differential sputtering by altering the morphology of the target entails leaving the beam at regular locations in the disrupted region for a longer period, not only damaging the array under the beam, but creating a substantial hole, thereby creating a non-uniform surface topography. FIG. 13 shows a TEM image of an array of disrupted regions prepared with the first approach.

Another novel technique that has been found useful for achieving uniform removal entails milling a target at a first series of pixels to alter the morphology of the target, such as by disrupting its crystal structure or changing the surface topography. Material is removed from the surface during this step or during a subsequent step. A subsequent milling step is then typically performed to provide a predetermined topography, typically a smooth, planar floor, to the milled area.

An altered morphology can be achieved, for example, by milling at non-contiguous pixel locations to create a series of holes. The milling of non-contiguous pixels can be performed in a single step or in several steps, with the pixel spacing progressively decreasing in subsequent steps. Successful milling of copper using this technique has been achieved with as few as two and as many as ten milling steps, depending on specific copper characteristics such as thickness and grain structures. This technique can be used with or without applying a sacrificial layer as described above. The final milling step is performed with pixel spacing similar to or less than the beam diameter.

This technique may inhibit the formation of etch-resistant areas, or it may prevent propagation of etch resistant areas, for example, because the holes may isolate the copper into segments that the etch resistant areas are unable to propagate across.

This technique not only prevents formation of the etch resistant area and produced uniform milling, it also increases the milling rate of the copper conductor in general. Because of the finite edge resolution of the ion beams, the sides of the milled holes are not exactly perpendicular to the surface. This increases the exposed surface area of the target and causes some of the impacting ions to strike part of the target surface at a non-normal angle. Both the increased surface area and the non-normal angle of incidence are thought to increase the etch rate.

Figure 14:
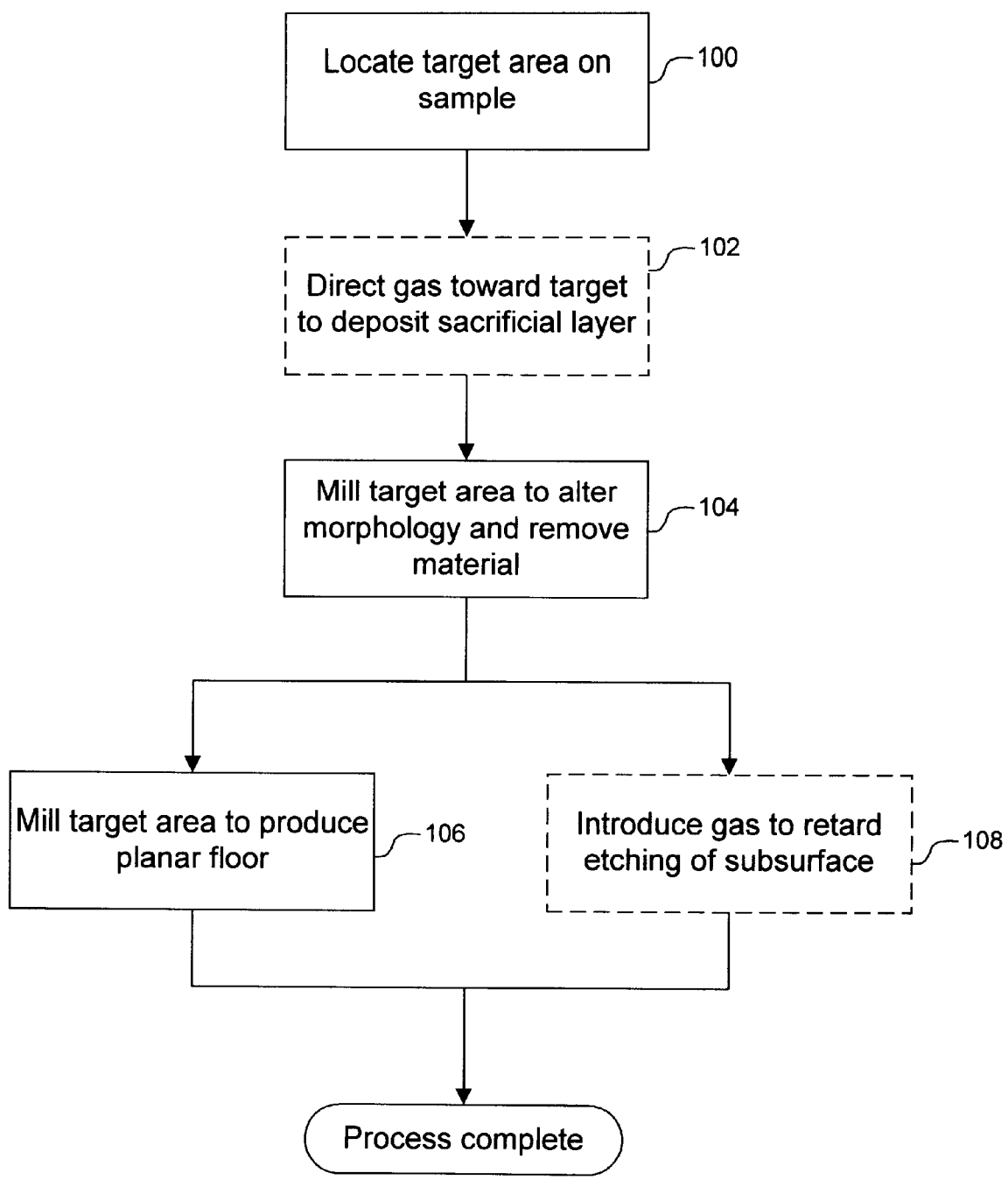
FIG. 14 is a flowchart showing the steps of an embodiment of the invention.

In accordance with a system embodying this aspect of the invention, signals applied to deflection controller and amplifier 36 cause the focused ion beam to move within a target area to be milled in a pattern that increases the milling rate and produces more uniform material removal. FIG. 14 is a flowchart showing the steps involved in a preferred embodiment of the present invention. In step 100, a target area to be milled is located on sample 22 in lower chamber 26. Step 102 shows that a precursor gas, as described above, for depositing a sacrificial layer upon bombardment of an ion beam is optionally directed to the sample.

In step 104, the target area is milled to alter the morphology of the target area and preferably to remove material. For example, the ion beam can move in a pattern that produces an uneven surface, such as by milling the sample at a series of non-contiguous points to produce a series of holes, rather than moving in a conventional pattern of overlapping pixels.

To produce a series of hole, the target area is milled using a pixel spacing greater than the beam spot size, defined as the diameter from edge to edge of the ion beam at the target surface, the edge of the beam being considered the point where the beam intensity drops to one tenth of its maximum value.

The ion beam typically has a spot size for milling of between 0.05 $\mu$m and 0.15 $\mu$m and a pixel spacing of, for example, 0.5 $\mu$m to 0.10 $\mu$m can be used. Depending upon the target to be milled, beams as small as 0.005 $\mu$m or smaller are readily attainable and can be used, as can beams as large 0.8 $\mu$m or larger, and the preferred pixel spacing will vary with the beam diameter. Depending upon the material being milled, the size of the area being milled, the characteristics of the ion beam being used, step 104 could include several sub-steps. For example, substeps using different pixel spacings could be used, with each subsequent substep using a pixel spacing smaller than that of the previous sub step. The morphology of the target could also be changed in step 104 by creating an array of disrupted regions using the ion beam to create very small depressions each surrounded by implantation damage.

In step 106, the target area is milled to produce a desired topography, typically a smooth, planar floor on the target area. Step 106 typically entails milling using a pixel spacing smaller than that used step 104 and typically entails using a pixel spacing similar to or less than the beam diameter. The relative amounts of material removed in steps 104 or 106 will vary with the implementation. Step 108 shows that a selectively etch retarding gas can be optionally be applied preferably near the completion of the milling operation during step 106, to decrease the etch rate of the underlying material to further reduce any unintentional etching of the underlying substrate.

A sacrificial layer can be deposited and etched as described above during any of the milling steps 104 or 106, although the sacrificial layer is, in some preferred embodiments, not deposited during the final milling step 106, thereby avoiding leaving deposited material on the target. In some embodiments, such as the milling of copper in a tantalum-containing liner using a tungsten hexacarbonyl precursor gas for the sacrificial layer, the sacrificial layer can be used throughout all milling steps, because the sacrificial layer precursor inhibits etching of the underlying material. Depending upon the material being removed, an etch enhancing gas can also be applied during the entire milling process to either increase the etch rate of the milled thin-film metal or inhibit the etch rate of the lower level dielectric under the film.

In one embodiment, referred to as Variable Pixel Milling, the invention uses a series of "milling boxes." A milling box is defined as a group of milling locations or pixels spaced apart by specified amounts in the x and y directions. An average ion dose, expressed as charge per unit area, is specified for each milling box. The ion beam moves between milling locations in the box, milling at the milling locations until each milling location in the box has received approximately the designated average dosage specified for the box. At each milling location, a hole having a diameter roughly equivalent to the beam spot size is milled. In applying the dose, the ion beam typically visits each point in the box multiple times, rather than delivering to each point the entire dose for the box during a single dwell period. After the first milling box is completed, the sample surface will have multiple holes separated by unmilled material.

Multiple milling boxes can be applied, each having successively closer pixels. The "nested" boxes are positioned over the desired feature of interest and the milling is performed serially, with subsequent boxes having closer pixel spacing. The result is a series of segregated copper islands that appear to suppress the formation of a highly channelling region that may appear black on the display screen. By suppressing the formation of this region, the milling produces a flat, uniform surface. In addition, the increased surface area achieved by the formation of these copper islands enhances overall milling efficiency.

Some of the holes milled in subsequent mill boxes will typically overlap previously milled holes. Upon finishing the complete set of milling boxes, however, the amount of material removed from each point in the sample is approximately equal to produce a uniform, planar floor over the entire area milled. The last milling box typically uses a pixel spacing that is comparable to or smaller than the beam spot size to produce a smooth, uniformly milled area. In some applications, only two milling boxes are required: a first box having a pixel spacing greater than the beam diameter and a second mill box having a pixel spacing less than the beam diameter. In applications in which the beam diameter is very small, the pixel spacing in step 106 may be somewhat greater than the beam diameter.

In one preferred embodiment for milling a copper interconnect using a 150 $\mu$m aperture in the FIB column and a beam current of 2.04 nA, six milling boxes are used. The ion beam has a beam spot size of between 0.05 $\mu$m and 0.10 $\mu$m. The parameters of each box are shown below in Table 2 for a copper thickness of 1.0 $\mu$m.

TABLE 2

| Box Number | Pixel space X ($\mu$m) | Pixel space Y ($\mu$m) | Average Dose (nC/($\mu$m$^2$)) |
| --- | --- | --- | --- |
| 1 | 0.50 | 0.50 | 0.5 |
| 2 | 0.40 | 0.40 | 0.4 |
| 3 | 0.30 | 0.30 | 0.4 |
| 4 | 0.25 | 0.25 | 0.4 |
| 5 | 0.10 | 0.10 | 0.25 |
| 6 | 0.05 | 0.05 | 0.25 |

The first five of the milling boxes of Table 2 use a pixel spacing that is significantly larger than those used for standard default milling. Only the last milling box uses the conventional default scan spacing. Within each milling box, the beam makes multiple scans, that is, each pixel is milled multiple times, until it has received approximately the average dose designated for the box. The beam typically dwells at each pixel for approximately 5 $\mu$sec, resulting in a dose at each pixel of about 0.001 nC during each dwell period. Although six milling boxes are shown in Table 2, in other embodiments, two milling boxes are used, the pixels in the first milling box being non-contiguous and separate, for example, by 50 $\mu$m, and the pixels in the second milling box overlapping, for example separated by 0.05 $\mu$m.

Figure 15A:
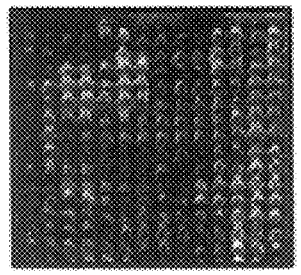
FIGS. 15A–15F show samples after a series of milling operations in accordance with the method of FIG. 14.
Figure 15B:
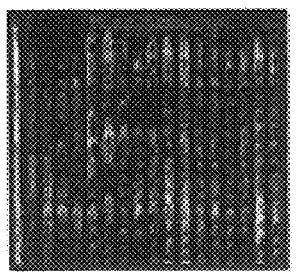
Figure 15C:
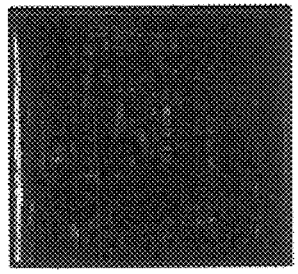
Figure 15D:
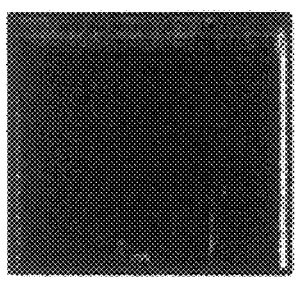
Figure 15E:
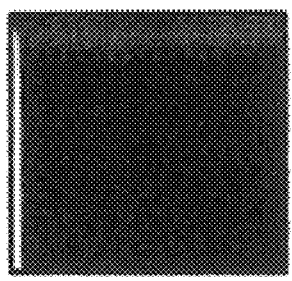
Figure 15F:
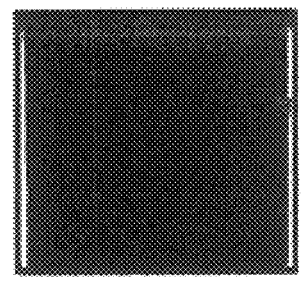
Figure 16B:
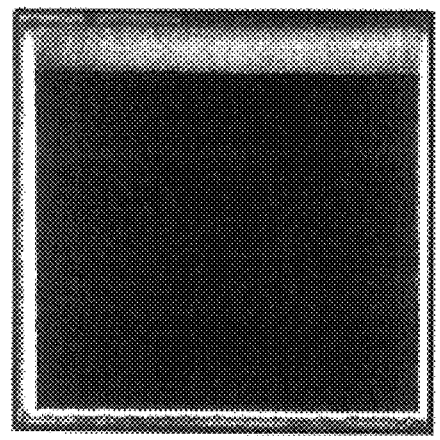
FIG. 16B shows the results of milling in accordance with the invention of FIG. 14 using a dose of 5.5 $nC/\mu m^2$ in each box.
Figure 16A:
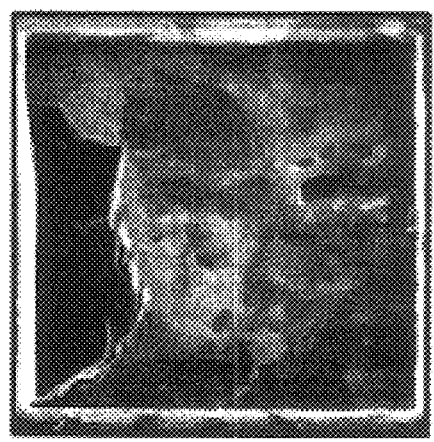
FIG. 16A shows the results of a conventional raster milling.

FIGS. 15A–15F shows the sample after each of the milling boxes of Table 2 is sequentially applied, with FIG. 15F showing a sample after the last milling box is complete. FIG. 15F shows the sample having a smooth bottom surface with no residual copper evident. FIG. 16A shows a sample copper interconnect milled using convention milling, and FIG. 16B shows for comparison a similar copper interconnect milled using, without a sacrificial layer, first non-contiguous pixels and subsequently overlapping pixels.

Mill boxes have been successfully scaled over a wide range of sizes which extend from greater than 20 $\mu$m×20 $\mu$m to 1 $\mu$m×1 $\mu$m using a 150 $\mu$m aperture. The boxes are imply expanded or contracted to the desired area, maintaining the same pixel spacing and dosages.

Use of apertures that are either larger or smaller than 150 $\mu$m requires careful scaling of the pixel spacing for the successful execution of this procedure. Applicants have scaled milling boxes over an aperture range of 50 $\mu$m to 150 $\mu$m. For example, to maintain the milling time to as short a period as possible for areas larger than 20 $\mu$m×20 $\mu$m, a FIB operator can choose a larger aperture which provides both an increase in spot size and greater beam current. As the spot size increases, the pixel spacing in the multiple boxes must be correspondingly increased, so that the pixels are not contiguous in the first few boxes. Skilled persons will be able to determine without undue experimentation a set of boxes to use for any aperture size guided by the example provided above.

Applicants have also found that the milling specifications, that is, the pixel spacing, dose, ion energy, beam size, and other parameters, of each box, as well as the number of different boxes used, may be varied to optimize milling depending on the copper characteristics, such as the copper grain structure and thickness of the material being milled. Applicants have successfully milled copper using as few as two and as many as ten milling boxes. The specification of each milling box and the number of boxes can be determined experimentally using the example and information provided above as a guide.

Although in the patterns described above, the milling is being performed in rectangular arrays of fixed pixel spacings within each box, the invention is not limited to that embodiment. For example, the pixel spacing can be gradually reduced, rather than being reduced in discrete steps, and the milling locations do not need to be distributed in a rectangular or regular pattern, so long as the pixels are spaced widely enough to prevent the growth of etch-resistant areas and the amount of material eventually removed from each point is about the same to produce a flat, smooth, planar floor. The pixel spacing could even remain unchanged, with the pixel locations changing in subsequent scans to produce a flat, smooth, planar floor.

Applicants have also found that milling with a reduced beam energy can also prevent the formation of the etch resistant region, even without the use of a sacrificial layer or the use a step to alter the morphology of the target area. A preferred reduced beam energy provides sufficient energy to sputter the copper at an acceptable rate, yet provides insufficient excess energy to form etch-resistant regions. For example, the accelerating voltage of the focused ion beam could be reduced from the typical milling range of 30 keV to 50 keV to impart less into the target per ion. A preferred beam energy is less than about 20 keV and more preferably less than about 10 keV. Applicants have found an energy of about 5 keV to be suitable for some copper targets, although beam energies as low as 1 keV or lower may also be useful in some applications.

As mentioned previously, although the detailed description herein above is specific to copper, it should be recognized that other crystalline structures could benefit from the sputtering technique of the present invention. For instance, some examples of structures that could benefit include gold based, platinum based, tungsten based, nickel based, and chromium based crystalline structures. Note that this list is not meant to limit the scope of the present invention, as it could apply to any crystalline structure that could benefit from the effect of the different crystallographic orientation being reduced.

It is noted that although the continuous flow of precursor gas such as tungsten hexacarbonyl is described herein above for the preferred embodiment of the present invention, this is not meant to limit the scope of the present invention. Any flow regimen that allows for appropriate levels of the sacrificial layer precursor to be adsorbed at each pixel location before the ion beam returns to that location is sufficient.

Although the description of the present invention above is mainly directed at a method of sputtering, it should be recognized that an apparatus performing the operation of this method would further be within the scope of the present invention. Yet further, it should be recognized that embodiments of the present invention could be implemented within control logic (software and/or hardware) or even as a control software program within a computer readable storage medium.

To assist skilled persons to better understand the process described herein, applicants have described above theoretical mechanisms that account for the success of the invention. The invention has been shown to work empirically, and its utility is independent of the validity of theories of the underlying mechanism.

The preferred embodiment uses a focused ion beam, although the method of the present invention may also be useful for electron beam processing. The invention has been shown to solve the problem of milling copper interconnects, but can be applied to any charged particle milling including plasma gas ion sources and is not limited to any specific material or application.

Persons skilled in the art will appreciate that there are yet more alternative implementations and modifications possible for implementing the present invention, and that the above implementations are only illustrations of certain embodiments of the invention. The scope of the invention, therefore, is only to be limited by the claims appended hereto.

What is claimed is:

1. A method of removing material from an area of a target, the method comprising:
   forming a layer over the area of the target by ion beam deposition; and
   directing anion beam toward the area of the target to remove material, the formed layer interacting wit the ion beam to increase the uniformity of the material removal by the ion beam.

2. A method according to claim 1 in which directing an ion beam toward the area of the target includes removing a substantial portion of the layer as the ion beam removes the material from the area of a target.

3. A method according to claim 1, wherein the material to be removed includes atoms positioned in crystal planes and wherein the layer deflects the ions in the ion beam to vary the angles of incidence of the ions with respect to the crystal planes, thereby reducing the effects of the orientation of the crystal planes on the milling rate.

4. A method according to claim 1, wherein the material to be removed includes atoms arranged in a crystalline structure and wherein the ion beam causes atoms in the layer to disrupt the crystal structure, thereby reducing the effects of the crystal structure on the milling rate.

5. A method according to claim 1 in which forming a layer includes directing a precursor gas toward the area of the target concurrently with directing the ion beam toward the area of the target, the precursor gas decomposing in the presence of the ion beam to form the layer.

6. A method according to claim 5, wherein:
   the precursor gas adheres to the target surface; and
   the ion beam dwells for dwell times at multiple dwell points in the area of the target, the dwell time at each dwell point being sufficient to decompose substantially all of the precursor gas adhered to target at the dwell point.

7. A method according to claim 6, wherein the time at each dwell point is sufficient to remove substantially all of the layer.

8. A method according to claim 6, wherein the ion beam is directed to each dwell point multiple times, the time interval between successive dwells at the same point being sufficiently long to adhere sufficient precursor molecule to the dwell point to form a new layer.

9. A method according to claim 5, wherein the precursor gas comprises metallorganic molecules.

10. A method according to claim 9, wherein the metallorganic gas molecules comprise tungsten, platinum, or gold.

11. A method according to claim 1, wherein directing an ion beam toward the area of the target to remove material includes directing an ion beam toward the area of the target to alter the morphology of the target and directing an ion beam toward the area of the target to produce a predetermined surface topography.

12. A method according to claim 1, wherein the ion beam has a beam diameter and wherein directing an ion beam toward the area of the target comprises:
   directing the ion beam to first dwell points within the area of the target, the first dwell points spaced further apart than the beam diameter; and
   directing the ion beam to second dwell points within the area of the target, the second dwell points spaced closer together than the beam diameter, thereby producing a smooth floor on the area of the target to which the ion beam is directed.

13. A method according to claim 12, further comprising after directing the ion beam to the first dwell points and before directing the ion beam to the second dwell points, directing the ion beam to additional dwell points or sets of dwell points within the area of the target, the additional dwell points or sets of dwell points being spaced closer together than the first dwell points are spaced and further apart than the second dwell points are spaced.

14. A method according to claim 1, wherein the layer comprises noble gas atoms, silicon atoms, or oxygen atoms.

15. A method according to claim 1, wherein the material to be removed includes copper atoms.

16. A method according to claim 1, wherein the material to be removed includes gold, platinum, tungsten, nickel or chromium atoms.

17. A method according to claim 1 further comprising applying of a plurality of primer atoms prior to forming the layer, the primer atoms facilitating the formation of the layer.

18. A method according to claim 1 in which the target includes a second material located near the material, to be removed, and further comprising directing a gas toward the target, the gas inhibiting removal of the second material.

19. A method of focused ion beam machining to remove material on a target, comprising:
   directing a precursor gas toward the target; and
   directing an ion beam toward the target to decompose the precursor gas to form a sacrificial layer, the sacrificial layer interacting with the ion beam to cause a substantially uniform etch rate regardless of the crystal orientation of the material being removed.

20. A method according to claim 19, wherein directing an ion beam toward the target includes directing an ion beam to dwell for a dwell period at each of multiple dwell points on the target, the dwell periods being sufficient to substantially remove the sacrificial layer.

21. A method according to claim 20, wherein directing an ion beam includes returning the ion beam to each dwell point multiple times, the time between subsequent return to a dwell point being sufficient for a sufficient quantity of precursor to adhere to the target to form a new sacrificial layer during each return to the dwell point.

22. A method according to claim 19, wherein directing an ion beam toward the area of the target to remove material includes directing an ion beam toward the area of the target to alter the morphology of the target and directing an ion beam toward the area of the target to produce a predetermined surface topography.

23. A method according to claim 19 in which the target includes a second material located near the material to be removed, and further comprising directing a gas toward the target, the gas inhibiting removal of the second material.

24. A method according to claim 19 in which:
the material to be removed is conductive;
directing an ion beam toward the target includes sputtering the conductive material, some of which is redeposited onto the target; and further comprising
directing a gas toward the target, the gas reducing the conductivity of the redeposited material.

25. A method according to claim 19, wherein the ion beam has a beam diameter and wherein directing an ion beam toward the area of the target comprises:
directing the ion boom to first dwell point within the area of the target, the first dwell points spaced further apart than the beam diameter and
directing the ion beam to second dwell points within the area of the target, the second dwell points spaced closer together than the beam diameter, thereby producing a smooth floor on the area of the target to which the ion beam is directed.

26. A method according to claim 25, further comprising after directing the ion beam to the first dwell points and before directing the ion beam to the second dwell points, directing the ion beam to additional dwell points or sets of dwell points within the area of the target, the additional dwell points or sets of dwell points being spaced closer together than the first dwell points are spaced and further apart than the second dwell points are spaced.

27. A method of removing material from an area of a target, the method comprising;
directing an ion beam toward the area of the target to alter the morphology of the material;
directing an ion beam toward the area of the target to remove material from the target; and
directing an ion beam toward the area of the target to produce a predetermined topography at the target area,
wherein altering the morphology of the material reduces the effects of the crystal structure of the material to allow uniform removal of the material.

28. A method according to claim 27 in which altering the morphology and removing material occurs concurrently.

29. A method according to claim 27 in which altering the morphology includes disrupting the crystal structure of the area.

30. A method according to claim 27 in which altering the morphology of the material includes producing multiple holes in the area.

31. A method according to claim 30 in which producing multiple holes in the area comprises milling at a pixel spacing greater than the beam diameter.

32. A method according to claim 31 in which milling at a pixel spacing greater than the beam diameter includes milling at multiple pixel spacing, the pixel spacing decreasing in subsequent milling steps.

33. A method according to claim 27 in which producing a predetermined topography at tho target area comprises milling using a pixel spacing approximately the same as or less than the beam diameter to produce a planar floor.

34. A method of reducing current leakage caused by redeposition of conductive material sputtered by a focused ion beam, the method comprising:
directing a focused ion beam toward a conductor to sputter the conductive material making up the conductor, some of the sputtered conductive material being redeposited onto areas of redeposition; and
directing a substance toward the substrate, the substance interacting with the sputtered conductive material to reduce the conductivity of the sputtered conductive material, thereby reducing leakage caused by redeposition of conductive material sputtered by a focused ion beam.

35. An ion beam system for removing material from an area of a target, comprising:
an ion source for providing ions;
ion optical elements for forming ions from the ion source into a beam having a diameter and directing the beam toward an area on a target;
a gas injection system for directing a precursor gas toward the target to form under bombardment of the ion beam a sacrificial layer,
the ion optical elements and the gas injection system being adjusted to deliver ions and precursor gas at rates such that during each dwell period, a layer of decomposition products is formed, interacts with ion beam in etching the material, and is itself substantially removed so that etching of the material is substantially uniform over the area on the target with the decomposition products substantially removed.

36. A system according to claim 35 further comprising a controller for controlling the ion beam, the controller directing the ion beam to first dwell points within the area of the target, the first dwell points spaced further apart than the beam diameter and subsequently the controller directing the ion beam to second dwell points within the area of the target, the second dwell points spaced closer together than the beam diameter, thereby producing a smooth floor on the area of the target to which the ion beam is directed.

37. A method of etching a copper conductor in a microelectronic circuit, the method comprising:
forming a sacrifical layer on the surface of the copper conductor;
directing an ion beam onto the sacrificial layer, the sacrificial layer increasing uniformity of the removal of the copper conductor by the ion beam.

38. A method according to claim 37, wherein forming a sacrificial layer includes decomposing a precursor gas in the presence of the ion beam.

39. A method according to claim 38, wherein the precursor gas comprises metallorganic gas molecules.

* * * * *

UNITED STATES PATENT AND TRADEMARK OFFICE
CERTIFICATE OF CORRECTION

| | |
|---|---|
| PATENT NO. | : 6,641,705 B2 |
| APPLICATION NO. | : 09/818988 |
| DATED | : November 4, 2003 |
| INVENTOR(S) | : Michael Phaneuf et al. |

It is certified that error appears in the above-identified patent and that said Letters Patent is hereby corrected as shown below:

Column 1, Line 37 – Please change "Modem" to read --Modern--;

Column 2, Line 48 – Please change "etch" "mill" to read --"etch," "mill"--;

Column 3, Line 32 – Please change "of dielectric" to read --of the dielectric--;

Column 4, Line 32 – Please change "copper-based crystalline" to read --copper-based, crystalline--;

Column 5, Line 60 – Please remove "and";

Column 6, Line 2 – Please remove "and";

Column 6, Line 6 – Please change "box." to read --box;--;

Column 7, Line 32 – Please change "base" to read --based--;

Column 9, Line 7 – Please change "show" to read --shows--;

Column 10, Line 27 – Please change "a fine grained" to read --fine grained--;

Column 11, Line 14 – Please change "um" to read --µm--;

Column 11, Line 36 – Please change "illustrates" to read --illustrate--;

Column 13, Line 3 – Please change "illustrates" to read --illustrate--;

Column 14, Line 14 – Please change "beings" to read --being--;

Column 14, Line 43 – Please change "is of particularly" to read --is particularly--;

Column 14, Line 44 – Please change "hole" to read --holes--;

Column 16, Line 1 – Please change "hole" to read --holes--;

Signed and Sealed this
Twelfth Day of April, 2011

David J. Kappos
*Director of the United States Patent and Trademark Office*

CERTIFICATE OF CORRECTION (continued)
U.S. Pat. No. 6,641,705 B2

Column 17, Line 5 – Please change "channelling" to read --channeling--;

Column 19, Line 43 – Please change "anion" to read --an ion--;

Column 19, Line 44 – Please change "wit" to read --with--;

Column 20, Line 58 – Please remove the "," inserted after "material";

Column 21, Line 34 – Please change "boom" to read --beam--;

Column 21, Line 51 – Please change the ";" after "comprising" to reflect a --:--;

Column 22, Line 9 – Please change "tho" to read --the--;